(12) United States Patent
Hoshino et al.

(10) Patent No.: US 8,431,330 B2
(45) Date of Patent: *Apr. 30, 2013

(54) SURFACE-TREATING AGENT FOR PATTERN FORMATION AND PATTERN-FORMING METHOD USING THE SURFACE-TREATING AGENT

(75) Inventors: Wataru Hoshino, Shizuoka (JP); Hideaki Tsubaki, Shizuoka (JP); Masahiro Yoshidome, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/307,813

(22) Filed: Nov. 30, 2011

(65) Prior Publication Data

US 2012/0076991 A1    Mar. 29, 2012

Related U.S. Application Data

(62) Division of application No. 12/053,653, filed on Mar. 24, 2008, now Pat. No. 8,088,566.

(30) Foreign Application Priority Data

Mar. 26, 2007  (JP) ................................. 2007-079306
Nov. 30, 2007  (JP) ................................. 2007-311180

(51) Int. Cl.
*G03F 7/30*  (2006.01)

(52) U.S. Cl.
USPC ............ 430/312; 430/324; 430/330; 430/394

(58) Field of Classification Search .................. 430/312, 430/324, 330, 394
See application file for complete search history.

(56) References Cited

U.S. PATENT DOCUMENTS

| | | | |
|---|---|---|---|
| 5,652,084 A * | 7/1997 | Cleeves | ........................ 430/315 |
| 5,914,073 A | 6/1999 | Kobayashi et al. | |
| 7,105,272 B2 | 9/2006 | Sudo et al. | |
| 2004/0166431 A1 | 8/2004 | Inno | |
| 2005/0171228 A1 | 8/2005 | Hatton | |
| 2007/0166644 A1 | 7/2007 | Kim et al. | |

FOREIGN PATENT DOCUMENTS

JP    2005-197349 A    7/2005

OTHER PUBLICATIONS

F.S. Lai et al., "Resist Hardening Using a Conformable Mold", J. Vac. Sci. Technol. B., Jan./Feb. 1986, pp. 426-429, vol. 4, No. 1, American Vacuum Society.

* cited by examiner

*Primary Examiner* — John Chu
(74) *Attorney, Agent, or Firm* — Sughrue Mion, PLLC

(57) ABSTRACT

A surface-treating agent for forming a resist pattern, includes: a compound represented by formula (1) as defined in the specification, wherein the surface-treating agent is used in a step between a formation of a first resist pattern on a first resist film and a formation of a second resist film on the first resist pattern to form a second resist pattern, and a pattern-forming method uses the surface-treating agent.

9 Claims, 1 Drawing Sheet and also relates to a pattern-forming method using the same.
SURFACE-TREATING AGENT FOR PATTERN FORMATION AND PATTERN-FORMING METHOD USING THE SURFACE-TREATING AGENT This is a Divisional of U.S. application Ser. No. 12/053,653, filed Mar. 24, 2008 and claims the benefit of priority to Japanese Patent Application No. 2007-079306 filed on Mar. 26, 2007 and Japanese Patent Application No. 2007-311180 filed on Nov. 30, 2007. The entire disclosures of the prior applications are expressly incorporated herein by reference in their entirety.

BACKGROUND OF THE INVENTION

1. Field of the Invention

The present invention relates to a surface-treating agent for forming resist patterns used in the manufacturing processes of semiconductors such as IC and the like, liquid crystals, the manufacture of circuit substrates for thermal heads and the like, and lithographic processes of other photo-fabrications, and also relates to a pattern-forming method using the same.

In particular, the present invention relates to a surface-treating agent for forming a resist pattern suitable for exposure with an immersion projection exposure apparatus using far ultraviolet rays of wavelengths of 200 nm or less as a light source, and a pattern-forming method using the same.

2. Description of the Related Art

From the advent of the resist for a KrF excimer laser (248 nm) on, an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed area to thereby generate an acid, utilizing the generated acid as the reactive catalyst to change an alkali-insoluble group to an alkali-soluble group in the bake after exposure (PEB: Post Exposure Bake), and removing the exposed area by alkali development.

With the progress of fining of semiconductor elements, shortening of the wavelengths of exposure light source and increasing of the numerical aperture of the projection lens (high NA) have advanced, and now exposure apparatus using an ArF excimer laser having wavelength of 193 nm as a light source have been developed. The degree of achievement of fining of semiconductor element can be expressed by resolution, and can be expressed by the following expression:

(Resolution)=$k_1 \cdot (\lambda/NA)$ wherein $\lambda$ is the wavelength of the exposure light source, NA is the numerical aperture of the projection lens, and $k_1$ is the coefficient concerning the process.

As a technique for increasing resolution, what is called an immersion method of filling between a projection lens and a sample with a liquid of high refractive index (hereinafter also referred to as "immersion liquid") has been conventionally proposed.

As "the effect of immersion", the above resolution and depth of focus can be expressed by the following expressions in the case of immersion, taking $\lambda_0$ as the wavelength of the exposure light in the air, n as the refractive index of immersion liquid to the air, and $NA_0$=sin θ with θ as convergence half angle of the ray of light:

(Resolution)=$k_1 \cdot (\lambda_0/n)/NA_0$

That is, the effect of immersion is equivalent to the case of using exposure wavelength of the wavelength of 1/n. In other words, in the case of the projection optical system of the same NA, the depth of focus can be made n magnifications by immersion.

As a technique for further increasing resolution, a pattern-forming method using a special process is proposed. This is equivalent to lessening $k_1$ in the above expression of resolution. One such a process is a freezing process (JP-A-2005-197349 (The term "JP-A" as used herein refers to an "unexamined published Japanese patent application".) and J. Vac. Sci. Technol. B 4, 426 (1986)).

As disclosed, e.g., in JP-A-2005-197349, of the processes of forming a first resist pattern on a first resist film, forming a second resist film on the first resist pattern, and forming a second resist pattern on the second resist film, the freezing process means a process of changing the property of the first resist pattern by chemical or physical treatment so that the first resist pattern does not dissolve in a second resist solution or does not mix with the second resist film in forming the second resist film. By using this technique, a desired resist pattern can be formed in parts two times, so that twice the quantity of resolution can be realized as compared with an ordinary exposure process. Here, the first and second are orders of processes to form the first layer and the second as shown in FIGS. 1A to 1L.

As the known example of the freezing process, JP-A-2005-197349 can be exemplified. In the example, after forming the first resist pattern, the property of the first resist pattern is changed by the irradiation of the first resist pattern with vacuum ultraviolet ray so that the first resist pattern does not dissolve in a second resist solution. In connection with this method, there is described in the known example that the dimension of the first resist pattern is subjected to variation before and after irradiation with vacuum ultraviolet ray. Concerning this problem, a countermeasure of compensating for the dimension of the first resist pattern is devised taking the dimensional fluctuation by irradiation with vacuum ultraviolet ray into consideration. However, it is estimated that the quantities of dimensional fluctuation differ according to the dimensions of resist patterns, and it is actually impossible to design masks compensated in dimensions of actual patterns of semiconductor devices where patterns of various dimensions and forms are present. Accordingly, as the fundamental characteristics required of the freezing process, it is necessary to reconcile (i) the first resist pattern does not dissolve in the second resist solution, and (ii) the dimension of the first resist pattern does not vary before and after the change of the property of the first resist pattern. Further, in general, in the manufacturing process of a semiconductor circuit, a resist pattern is used to transfer the pattern by etching onto a substrate with the resist pattern itself as the mask. At this time, it is required that the etching resistance of the entire resist pattern is the same in arbitrary one pattern. Accordingly, it is further required of the freezing process (iii) the dry etching resistances of the first resist pattern and the second resist pattern are the same. However, materials and processes that satisfy all of these three characteristics have not been found yet.

SUMMARY OF THE INVENTION

The present invention has been done in view of the above circumstances. That is, the freezing process comprises forming a first resist pattern on a first resist film, and then forming a second resist film on the first resist pattern to form a second resist pattern thereon, and subjecting the first resist pattern to chemical treatment to thereby change the property of the first resist pattern so as not to dissolve in a second resist solution.

An object of the invention is to provide a surface treating agent for the chemical treatment of the first resist pattern in the freezing process so as to satisfy all the requisites of (i) the first resist pattern does not dissolve in the second resist solution, and (ii) the dimension of the first resist pattern does not vary, and further (iii) the dry etching resistances of the first resist pattern and the second resist pattern are the same. Another object is to provide an image-forming method using the same.

The above objects have been achieved by the following constitutions.

(1) A surface-treating agent for forming a resist pattern, comprising:

a compound represented by formula (1):

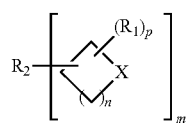

(1)

wherein m represents an integer of from 1 to 8;

$R_1$ represents a monovalent organic group;

$R_2$ represents an m-valent organic group, provided that $R_1$ and $R_2$ may be bonded to each other to form a ring, and when p represents 2 or more, a plurality of $R_1$'s may be bonded to each other to form a ring;

X represents an oxygen atom or a sulfur atom;

n represents an integer of from 0 to 10; and p represents an integer of 2n+3 or less, and wherein the surface-treating agent is used in a step between a formation of a first resist pattern on a first resist film and a formation of a second resist film on the first resist pattern to form a second resist pattern.

(2) The surface-treating agent as described in (1) above, wherein in the compound represented by formula (1), m represents 2 or more.

(3) The surface-treating agent as described in (1) or (2) above, which further comprises:

at least one organic solvent selected from the group consisting of an alcohol solvent, a carbon fluoride solvent and a saturated hydrocarbon solvent.

(4) The surface-treating agent as described in any of (1) to (3) above, wherein the compound represented by formula (1) has a molecular weight of from 100 to 1,000.

(5) The surface-treating agent as described in any of (1) to (4) above, wherein in the compound represented by formula (1), n is 1 or 2.

(6) The surface-treating agent as described in any of (1) to (5) above, wherein in the compound represented by formula (1), the m-valent organic group represented by $R_2$ has an aromatic ring.

(7) The surface-treating agent as described in any of (1) to (6) above, wherein in the compound represented by formula (1), the number of carbon atoms of $R_2$ exclusive of carbon atoms forming a ring is from 1 to 30.

(8) The surface-treating agent as described in any of (1) to (7) above, which changes a property of the first resist pattern so that the first resist pattern does not dissolve in a resist solution used in the formation of the second resist film.

(9) A method for forming a resist pattern, comprising:

forming a first resist pattern with a first resist composition;

treating the first resist pattern with the surface-treating agent as described in any of (1) to (8) above; and forming a second resist pattern on the first resist pattern with a second resist composition.

DETAILED DESCRIPTION OF THE INVENTION

Figure 1A:
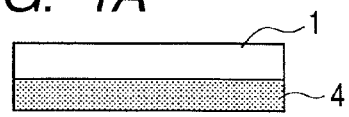
FIGS. 1A to 1L represent schematic views of a pattern-forming method using a freezing process, wherein 1 denotes a first resist, 1a denotes a pattern formed by using the first resist, 1b denotes a resist pattern 1a after treatment with the treating agent, 1c denotes a resist pattern 1b after second exposure and development, 2 denotes a second resist, 2a denotes a pattern formed by using the second resist, 3 denotes a treating agent, 4 denotes a semiconductor substrate (including an antireflection layer), m1 to m4 are exposure masks used in respective process and n denotes an ejection nozzle.

The present invention will be described in detail below.

In the specification of the invention, the first resist and the second resist are terms that are used for convenience to distinguish a resist composition for forming a first resist layer formed in the first place from a resist composition for forming a second resist layer formed after that in the later-described pattern forming process.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

A surface-treating agent for forming a pattern in the invention (hereinafter also referred to as simply "a treating agent") is a treating agent used in the former step of forming a second resist film on a first resist pattern to form a second resist pattern after forming the first resist pattern on a first resist film and contains a compound represented by formula (1).

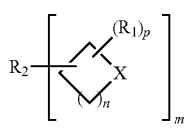

(1)

In formula (1), m represents an integer of from 1 to 8; $R_1$ represents a monovalent organic group; $R_2$ represents an m-valent organic group, provided that $R_1$ and $R_2$ may be bonded to each other to form a ring, and when p represents 2 or more, $R_1$ and a plurality of other $R_1$ may be bonded to each other to form a ring; X represents an oxygen atom or a sulfur atom; n represents an integer of from 0 to 10; and p represents an integer of 2n+3 or less.

The molecular weight of the compound represented by formula (1) is not especially restricted, but is preferably from 100 to 1,000, and especially preferably from 100 to 700. The molecular weight of the compound represented by formula (1) is preferably smaller in the point of restraining the increase in dimension of the first resist pattern.

In formula (1), m represents an integer of from 1 to 8, preferably from 2 to 4, and more preferably 2 or 3. When m is 2 or more, the dissolution of a first resist pattern in a second resist solution can be restrained by the crosslinking in the same or different resins by a treating agent. For the purpose of increasing reactivity, m is preferably smaller.

In formula (1), $R_1$ represents a monovalent organic group. When the organic group ($R_1$) is monovalent, $R_1$ and $R_2$ may be bonded to each other to form a ring. When p represents 2 or more, $R_1$ and a plurality of other $R_1$ may be bonded to each other to form a ring. When either m or p is 2 or more, a plurality of organic groups ($R_1$) may be the same or different.

As the monovalent organic group ($R_1$), e.g., an alkyl group, a cycloalkyl group, an aryl group, an aralkyl group, an alkenyl group, an alkoxyl group, an alkoxycarbonylamino group, a cyano group, etc., can be exemplified.

As the ring formed by bonding $R_1$ and $R_2$, e.g., a cyclopentyl group, a cyclohexyl group, a cycloheptyl group, a cyclooctyl group, a norbonyl group, an adamantyl group, etc., can be exemplified.

The alkyl group as the organic group ($R_1$) may have a substituent, and may have an oxygen atom, a sulfur atom or a nitrogen atom in the alkyl chain. Specifically, straight chain alkyl groups such as a methyl group, an ethyl group, an n-propyl group, an n-butyl group, an n-pentyl group, an n-hexyl group, an n-octyl group, an n-dodecyl group, an n-tetradecyl group, an n-octadecyl group, etc., and branched alkyl groups such as an isopropyl group, an isobutyl group, a t-butyl group, a neopentyl group, a 2-ethylhexyl group, etc., can be exemplified.

The cycloalkyl group as the organic group ($R_1$) may have a substituent, may be polycyclic, and may have an oxygen atom in the ring. Specifically, a cyclopropyl group, a cyclopentyl group, a cyclohexyl group, a norbornyl group, an adamantyl group, etc., can be exemplified.

The aryl group as the organic group ($R_1$) may have a substituent, and, e.g., a phenyl group, a naphthyl group, etc., can be exemplified.

The aralkyl group as the organic group ($R_1$) may have a substituent, and, e.g., a benzyl group, a phenethyl group, a naphthylmethyl group, a naphthylethyl group, etc., can be exemplified.

As the alkenyl group as the organic group ($R_1$), groups having a double bond at arbitrary position of the above alkyl group and cycloalkyl group can be exemplified.

As the alkoxyl group as the organic group ($R_1$) and the alkoxyl group in the alkoxycarbonylamino group, e.g., a methoxy group, an ethoxy group, a propoxy group, an n-butoxy group, a pentyloxy group, a hexyloxy group, a heptyloxy group, etc., can be exemplified.

As the examples of the substituents that each of the above organic groups ($R_1$) may have, e.g., a halogen atom, a hydroxyl group, a nitro group, a cyano group, a carboxyl group, a carbonyl group, a cycloalkyl group, an aryl group, an alkoxyl group, an acyl group, an acyloxy group, an alkoxycarbonyl group, an aminoacyl group, etc., can be exemplified. Concerning the cyclic structure in the aryl group and cycloalkyl group, an alkyl group can be exemplified as a further substituent. In connection with the aminoacyl group, an alkyl group having 1 or 2 carbon atoms can be exemplified as a further substituent.

It is preferred as the organic group ($R_1$) that a carbon atom contiguous to the carbon atom of the cyclic ether or cyclic thiol represented by formula (1) is unsubstituted, and more preferred organic group ($R_1$) is a straight chain alkyl group having from 1 to 5 carbon atoms.

The organic group ($R_1$) may have an oxygen atom, a sulfur atom or a nitrogen atom in the chain of the straight chain alkyl group. Specifically, straight chain alkyl groups such as a methyl group, an ethyl group, an n-propyl group, an n-butyl group, an n-pentyl group, etc., can be exemplified, and it is most preferred not to have an organic group ($R_1$) (i.e., p is 0).

$R_2$ represents an m-valent organic group. As the organic groups ($R_2$), e.g., an alkyl group, a cycloalkyl group, an aryl group, an aralkyl group, an alkenyl group, an alkoxyl group, an alkoxycarbonylamino group, a cyano group, etc., can be exemplified.

The alkyl group as the organic group ($R_2$) may have a substituent, and may have an oxygen atom, a sulfur atom or a nitrogen atom in the alkyl chain. Specifically, straight chain alkyl groups such as a methyl group, an ethyl group, an n-propyl group, an n-butyl group, an n-pentyl group, an n-hexyl group, an n-octyl group, an n-dodecyl group, an n-tetradecyl group, an n-octadecyl group, etc., and branched alkyl groups such as an isopropyl group, an isobutyl group, a t-butyl group, a neopentyl group, a 2-ethylhexyl group, etc., can be exemplified.

The cycloalkyl group as the organic group ($R_2$) may have a substituent, may be polycyclic, and may have an oxygen atom in the ring. Specifically, a cyclopropyl group, a cyclopentyl group, a cyclohexyl group, a norbornyl group, an adamantyl group, etc., can be exemplified.

The aryl group as the organic group ($R_2$) may have a substituent, and, e.g., a phenyl group, a naphthyl group, etc., can be exemplified.

It is preferred as the organic group ($R_2$) that a carbon atom contiguous to the carbon atom of the cyclic ether or cyclic thioether represented by formula (1) is unsubstituted. The number of carbon atoms of $R_2$ exclusive of those forming a ring is preferably from 1 to 30, and more preferably from 4 to 20. Further, it is preferred in $R_2$ that a part or all of the hydrogen atoms of the hydrocarbon group not directly bonding to the cyclic skeleton including X be substituted with halogen atoms.

It is also preferred to have an aromatic ring in the structure of $R_2$. For example, monocyclic aromatic benzene derivatives, compounds comprising a plurality of aromatic rings coupled (naphthalene, anthracene, tetracene, etc.), non-benzene aromatic derivatives, etc., are exemplified. As the examples of the non-benzene aromatic derivatives, a pyrrole residue, a furan residue, a thiophene residue, an indole residue, a benzofuran residue, a benzothiophene residue, etc., can be exemplified.

The range of n is from 0 to 10. For increasing crosslinking reactivity, n is preferably from 0 to 8, more preferably from 0 to 6, and still more preferably 0 or 1.

The amount of the compound represented by formula (1) is preferably from 0.1 to 100 mass % in all the amount of the treating agent, more preferably from 2 to 95 mass %, and still more preferably from 5 to 90 mass %. (In this specification, mass ratio is equal to weight ratio.)

The specific examples of the compound represented by formula (1) are shown below, but the invention is not restricted to these compounds.

As epoxy compounds, aromatic epoxide, alicyclic epoxide, and aliphatic epoxide are exemplified. As the aromatic epoxides, di- or poly-glycidyl ether produced by the reaction of polyhydric phenol having at least one aromatic nucleus or the alkylene oxide adduct thereof with epichlorohydrin, e.g., di- or poly-glycidyl ether of bisphenol A or the alkylene oxide adduct thereof, di- or poly-glycidyl ether of hydrogenated bisphenol A or the alkylene oxide adduct thereof, and a novolak type epoxy resin are exemplified. Here, as the alkylene oxides, ethylene oxide and propylene oxide are exemplified.

As the alicyclic epoxides, cyclohexene oxide or cyclopentene oxide-containing compounds obtained by epoxidizing a compound having at least one cycloalkane ring such as a cyclohexene or cyclopentene ring with a proper oxidizing agent such as hydrogen peroxide, peracid or the like are preferably exemplified.

As the aliphatic epoxides, diglycidyl ethers of aliphatic polyhydric alcohols or the alkylene oxide adducts thereof are exemplified. The specific examples of these diglycidyl ethers include diglycidyl ethers of polyalkylene glycols represented by diglycidyl ethers of alkylene glycols such as diglycidyl ether of ethylene glycol, diglycidyl ethers of propylene glycol, and diglycidyl ethers of 1,6-hexanediol, diglycidyl ethers of polyhydric alcohol such as di- or tri-glycidyl ether of glycerol or the alkylene oxide adduct thereof, diglycidyl ether of ethylene glycol or the alkylene oxide thereof, and diglycidyl ether of propylene glycol or the alkylene oxide adduct thereof. Here, as the alkylene oxides, ethylene oxide and propylene oxide are exemplified.

As the examples of monofunctional epoxy compounds, e.g., phenyl glycidyl ether, p-tert-butyl phenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, 3-vinyl-cyclohexene oxide, etc., can be exemplified.

As the examples of polyfunctional epoxy compounds, e.g., bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)-cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclo-hexane carboxylate, methylenebis(3,4-epoxycyclohexane), dicyclopentadiene diepoxide, di(3,4-epoxycyclohexylmethyl) ether of ethylene glycol, ethylenebis(3,4-epoxycyclohexane carboxylate), dioctyl epoxyhexahydrophthalate, di-2-ethyl-hexyl epoxyhexahydrophthalate, 1,4-butanediol diglycidyl ether, 1,6-hexanediol diglycidyl ether, glycerol triglycidyl ether, trimethylolpropane triglycidyl ether, 1,1,3-tetra-decadiene dioxide, limonene dioxide, 1,2,7,8-diepoxyoctane, 1,2,5,6-diepoxycyclooctane, etc., can be exemplified.

The examples of monofunctional oxetanes include, e.g., 3-ethyl-3-hydroxymethyloxetane, 3-(meta)allyloxymethyl-3-ethyloxetane, (3-ethyl-3-oxetanylmethoxy)methylbenzene, 4-fluoro-[1-(3-ethyl-3-oxetanylmethoxy)methyl]benzene, 4-methoxy-[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl)ether, 2-ethylhexyl-(3-ethyl-3-oxetanylmethyl)ether, ethyl diethylene glycol- (3-ethyl-3-oxetanylmethyl)ether, dicyclopentadiene-(3-ethyl-3-oxetanylmethyl)ether, dicyclopentenyloxyethyl-(3-ethyl-3-oxetanylmethyl)ether, dicyclopentenyl- (3-ethyl-3-oxetanylmethyl)ether, tetrahydrofurfuryl-(3-ethyl-3-oxetanylmethyl)ether, tetrabromophenyl-(3-ethyl-3-oxetanylmethyl)ether, 2-tetrabromophenoxy-ethyl(3-ethyl-3-oxetanylmethyl)ether, tribromophenyl-(3-ethyl-3-oxetanylmethyl)ether, 2-tribromophenoxy ethyl-(3-ethyl-3-oxetanylmethyl) ether, 2-hydroxyethyl-(3-ethyl-3-oxetanylmethyl) ether, 2-hydroxypropyl-(3-ethyl-3-oxetanylmethyl) ether, butoxyethyl (3-ethyl-3-oxetanylmethyl) ether, pentachlorophenyl(3-ethyl-3-oxetanylmethyl)ether, pentabromophenyl (3-ethyl-3-oxetanylmethyl)ether, bornyl(3-ethyl-3-oxetanylmethyl) ether, etc.

The examples of polyfunctional oxetanes include, e.g., 3,7-bis(3-oxetanyl)-5-oxa-nonane, 3,3'-[1,3-(2-methylenyl)-propanediylbis(oxymethylene)]bis-(3-ethyloxetane), 1,4-bis-[(3-ethyl-3-oxetanylmethoxy)methyl]benzene, 1,2-bis-[(3-ethyl-3-oxetanylmethoxy)methyl]ethane, 1,3-bis-[(3-ethyl-3-oxetanylmethoxy)methyl]propane, ethylene glycol-bis(3-ethyl-3-oxetanylmethyl)ether, dicyclo-pentenyl-bis(3-ethyl-3-oxetanylmethyl)ether, triethylene glycol-bis(3-ethyl-3-oxetanylmethyl)ether, tetraethylene glycol-bis(3-ethyl-3-oxetanylmethyl)ether, tricyclodecane-diyldimethylene(3-ethyl-3-oxetanylmethyl)ether, trimethylolpropanetris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritoltris(3-ethyl-3-oxetanylmethyl)ether, pentaerythritoltetrakis(3-ethyl-3-oxetanylmethyl)ether, dipentaerythritolhexakis(3-ethyl-3-oxetanylmethyl)ether, dipentaerythritolpentakis(3-ethyl-3-oxetanylmethyl)ether, dipentaerythritoltetrakis(3-ethyl-3-oxetanylmethyl)ether, caprolactone-modified dipentaerythritolhexakis(3-ethyl-3-oxetanylmethyl)ether, caprolactone-modified dipentaerythritolpentakis(3-ethyl-3-oxetanylmethyl)ether, ditrimethylolpropanetetrakis(3-ethyl-3-oxetanylmethyl)ether, EO-modified bisphenol A bis(3-ethyl-3-oxetanylmethyl)ether, PO-modified bisphenol A bis (3-ethyl-3-oxetanylmethyl)ether, EO-modified hydrogenated bisphenol A bis(3-ethyl-3-oxetanylmethyl) ether, PO-modified hydrogenated bisphenol A bis(3-ethyl-3-oxetanyl-methyl)ether, EO-modified bisphenol F (3-ethyl-3-oxetanyl-methyl)ether, etc.

In addition to the above compounds, epoxy compounds and oxetane compounds disclosed in JP-A-6-9714, JP-A-2001-31892, JP-A-2001-40068, JP-A-2001-55507, JP-A-2001-310938, JP-A-2001-310937, and JP-A-2001-220526 can be exemplified.

As the specific examples of compound group (A) having an oxygen atom represented by X, Compounds (A-01) to (A-55), and compound group (B) having a sulfur atom represented by X, Compounds (B-01) to (B-55) are shown below. However, the invention is not limited to these compounds.

As compound group (A), commercially available products can be used as they are, or compound group (A) can be easily synthesized according to Sharpless-Katsuki Epoxidation, Prilezhaev Epoxidation, and the like.

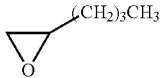
(A-01)

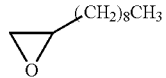
(A-02)

-continued
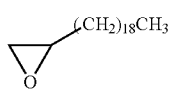 (A-03)
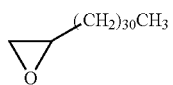 (A-04)
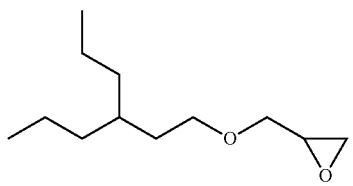 (A-05)
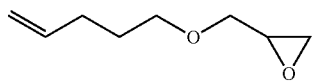 (A-06)
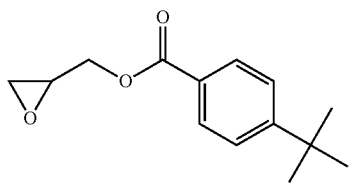 (A-07)
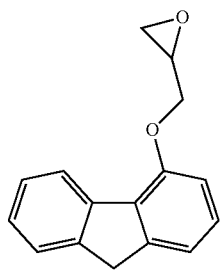 (A-08)
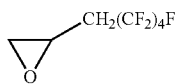 (A-09)
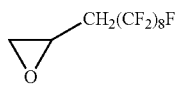 (A-10)
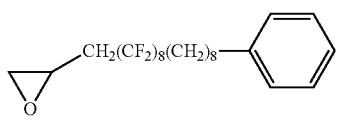 (A-11)
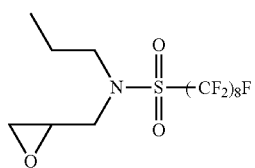 (A-12)
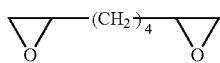 (A-13)
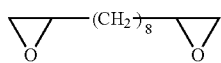 (A-14)
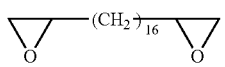 (A-15)
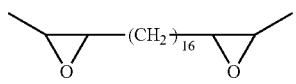 (A-16)
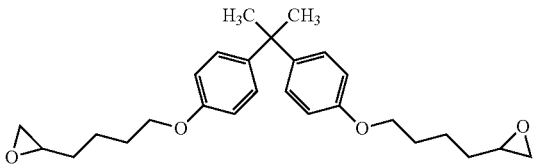 (A-18)
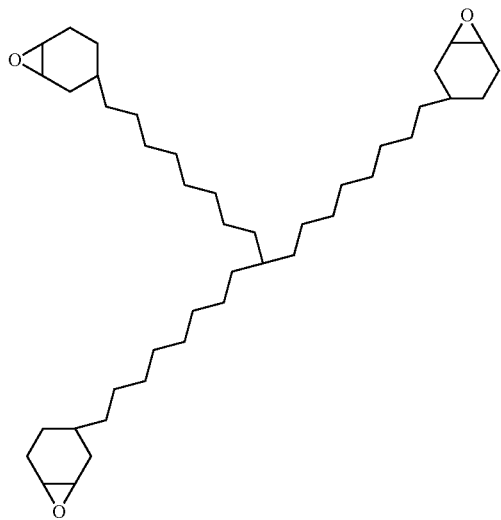

-continued
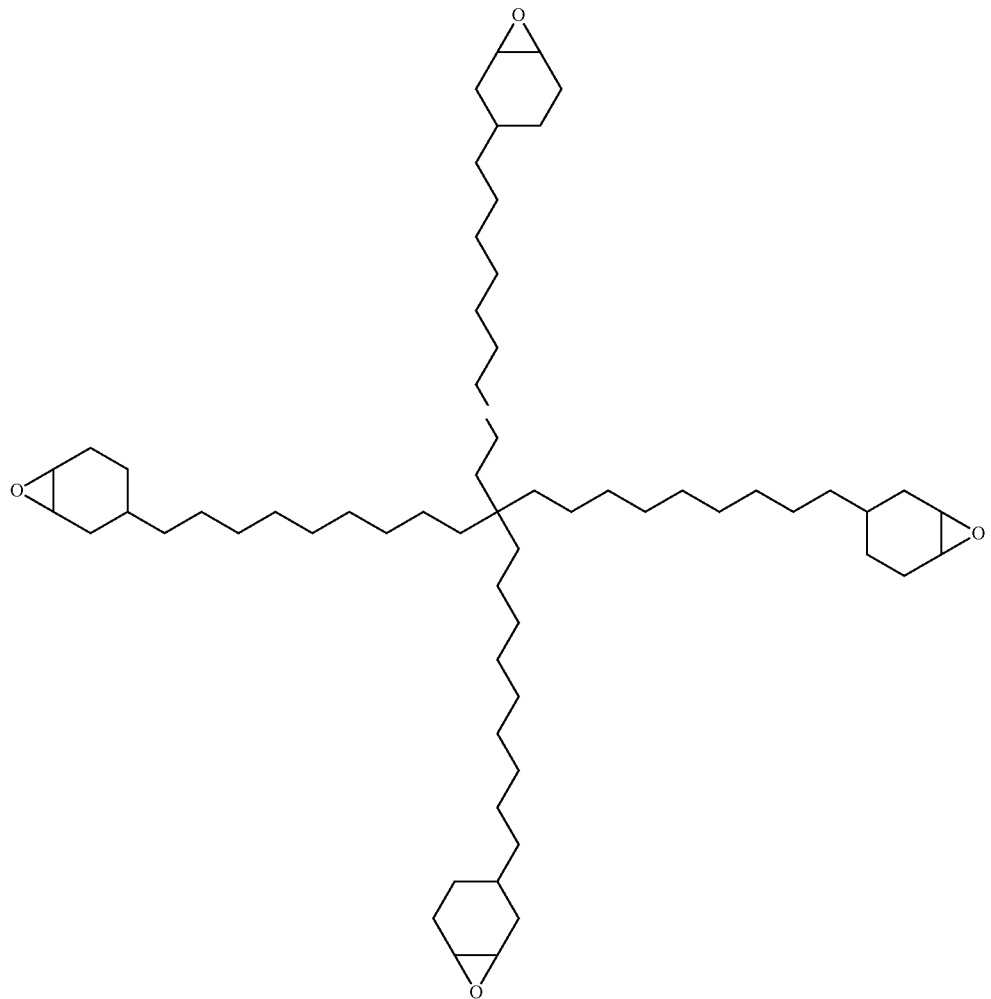
(A-19)
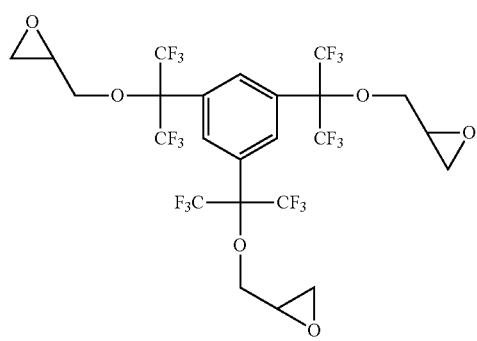
(A-20)
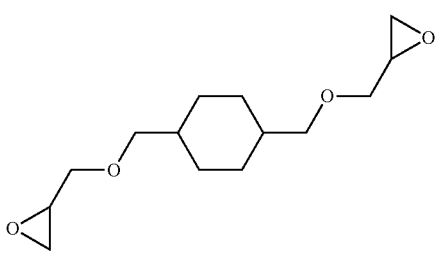
(A-21)
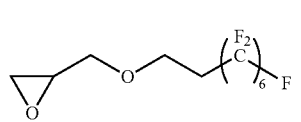
(A-22)
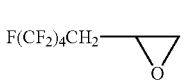
(A-23)
F(CF$_2$)$_4$CH$_2$—
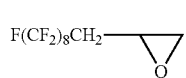
(A-24)
F(CF$_2$)$_8$CH$_2$—
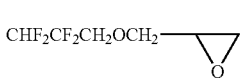
(A-25)
CHF$_2$CF$_2$CH$_2$OCH$_2$—
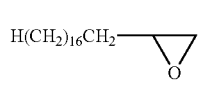
(A-26)
H(CH$_2$)$_{16}$CH$_2$—
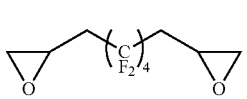
(A-27)

-continued
(A-28)
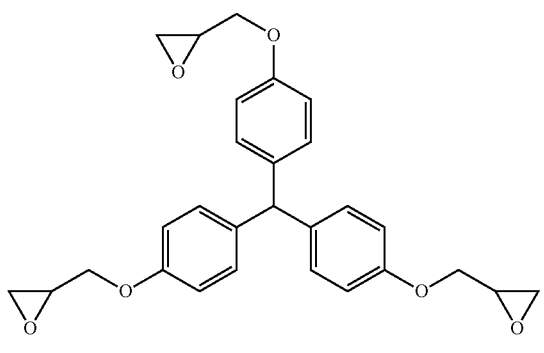
(A-29)
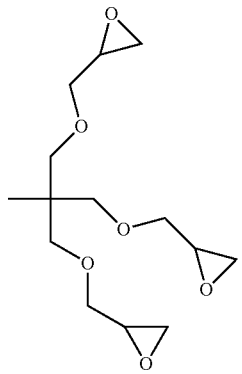
(A-30)
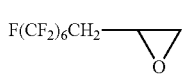
(A-31)
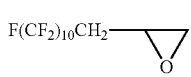
(A-32)
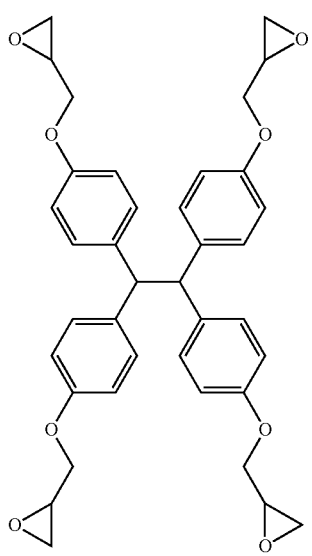
(A-33)
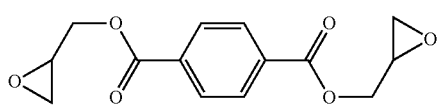
(A-34)
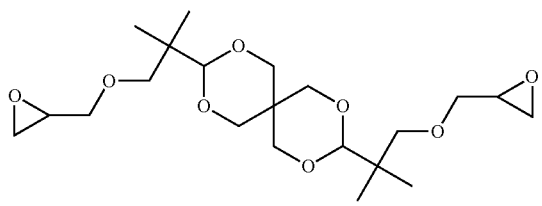
(A-35)
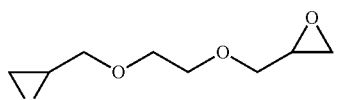
(A-36)
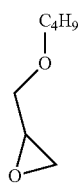
(A-37)
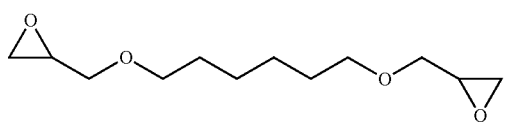
(A-38)
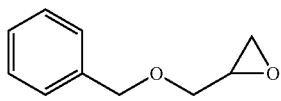
(A-39)

-continued
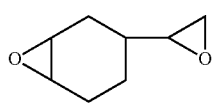
(A-40)
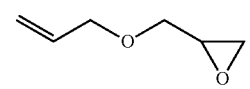
(A-41)
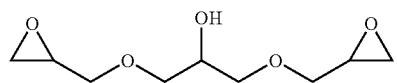
(A-42)
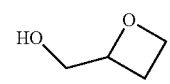
(A-43)
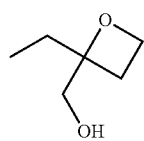
(A-44)
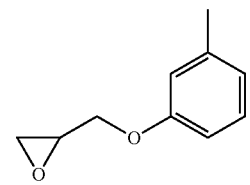
(A-45)
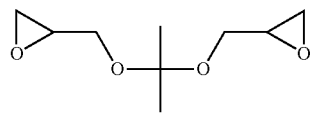
(A-46)
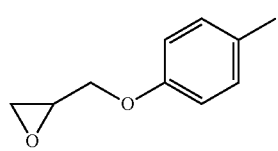
(A-47)
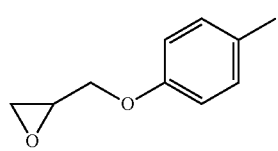
(A-48)
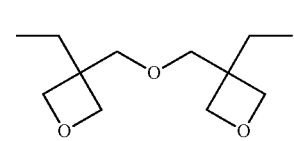
(A-49)
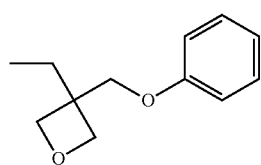
(A-50)
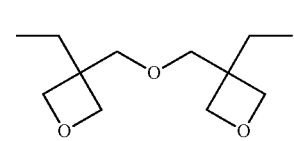
(A-51)
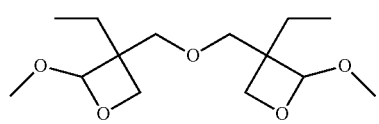
(A-52)
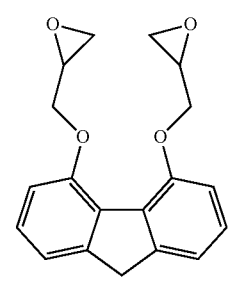
(A-53)
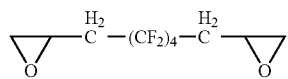
(A-54)
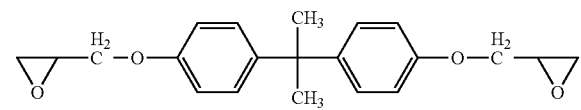
(A-55)

Compound group (B) is synthesized by the reaction of compound group (A) and potassium thiocyanide or thiourea (Scheme 1).
[Scheme 1]
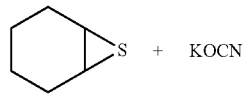
(B-01) 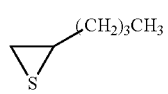
(B-02) 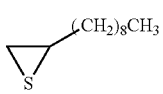
(B-03) 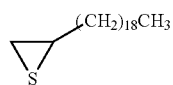
(B-04) 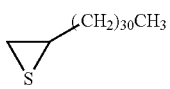
(B-05) 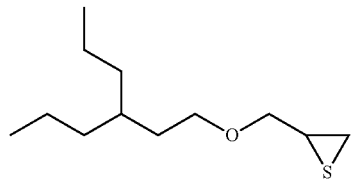
(B-06) 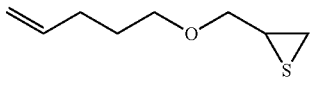
(B-07) 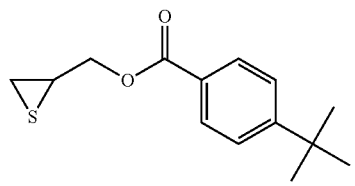
(B-08) 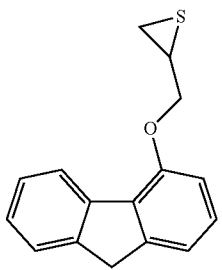
(B-09) 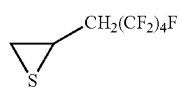
(B-10) 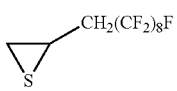
(B-11) 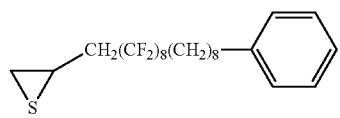
(B-12)
(B-13)
(B-14)
(B-15)
(B-16)

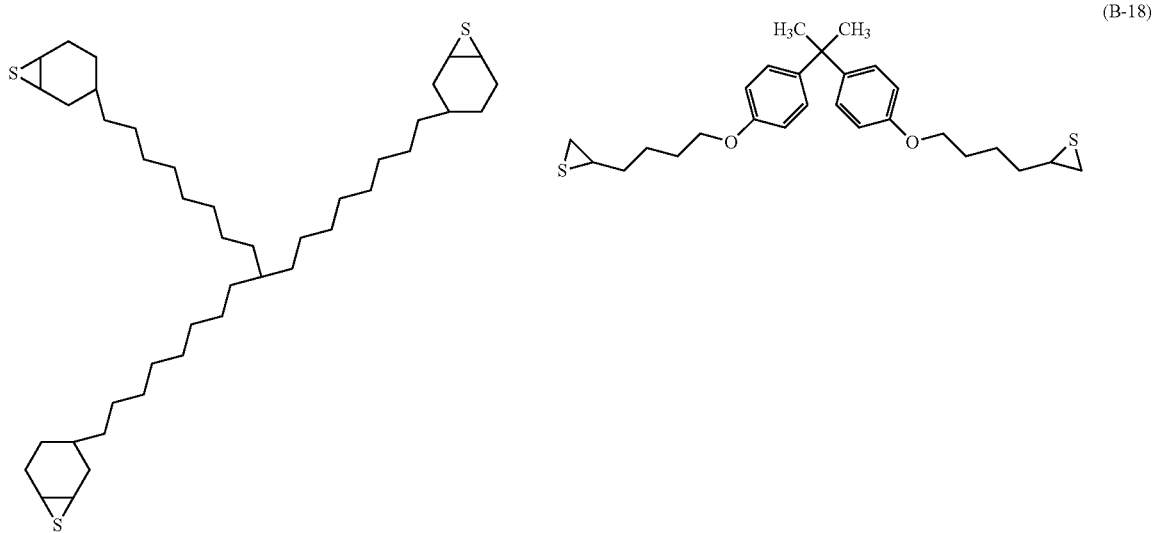
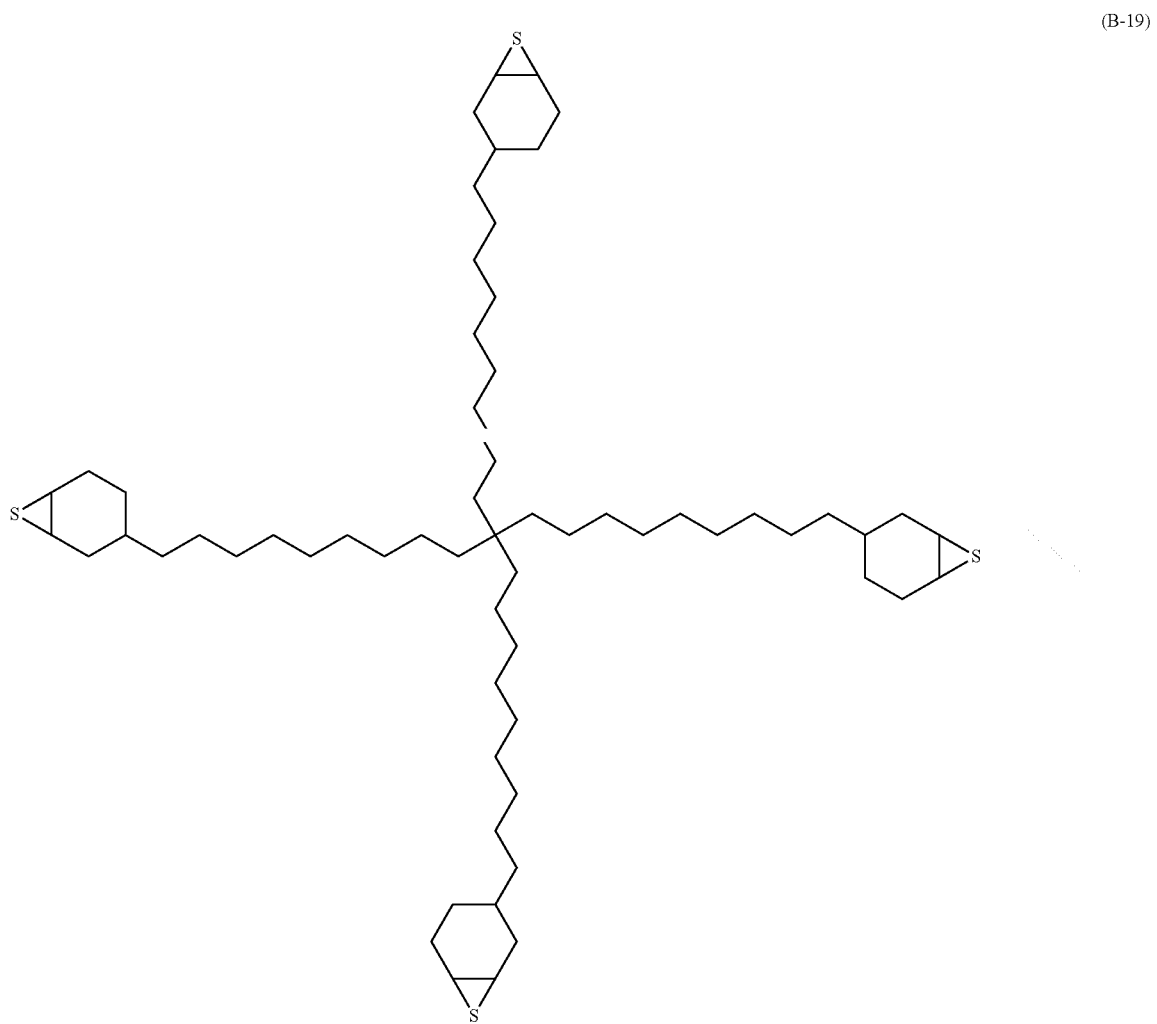

-continued
(B-20) 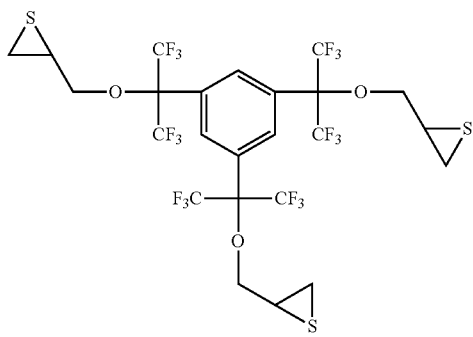
(B-21) 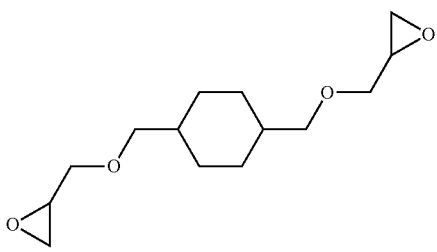
(B-22) 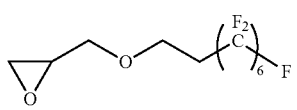
(B-23) 
(B-24) 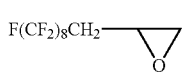
(B-25) 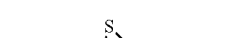
(B-26) 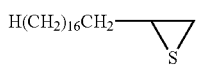
(B-27) 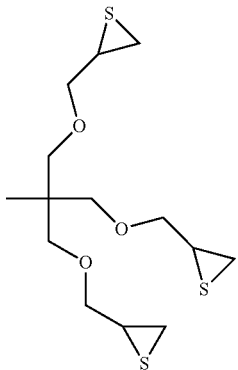
(B-28) 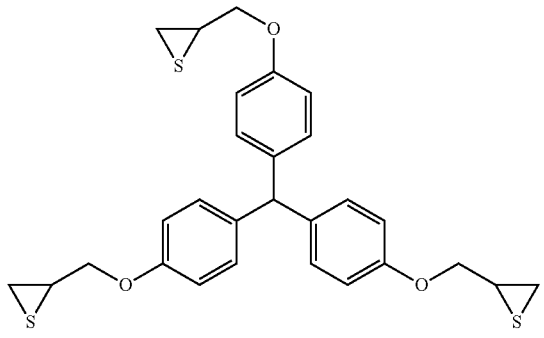
(B-29)
(B-30) 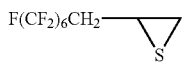
(B-31) F(CF$_2$)$_{10}$CH$_2$— (thiirane)
(B-32) 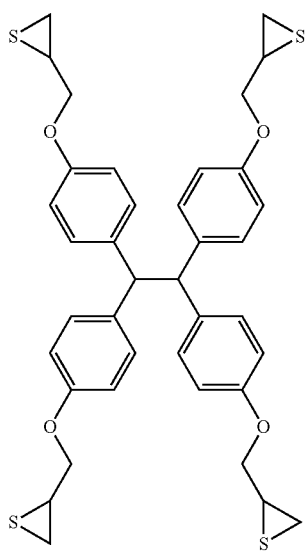
(A-33) 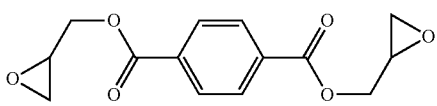

-continued
(B-34)
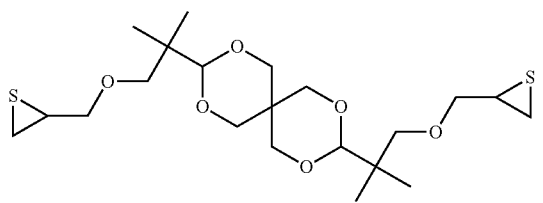
(B-35)
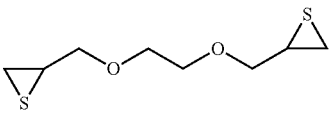
(B-36)
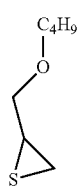
(B-37)
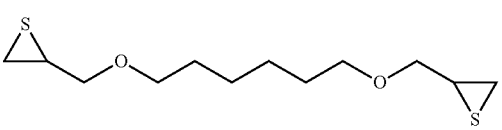
(B-38)
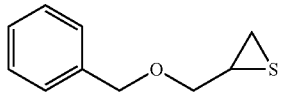
(B-39)
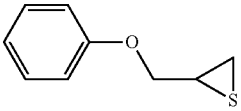
(B-40)
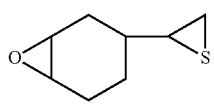
(B-41)
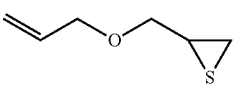
(B-42)
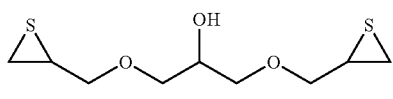
(B-43)
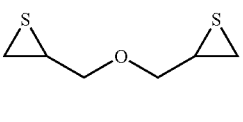
(B-44)
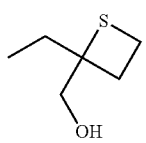
(B-45)
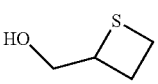
(B-46)
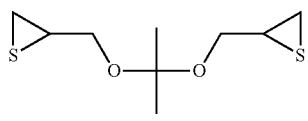
(B-47)
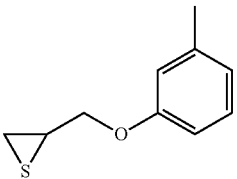
(B-48)
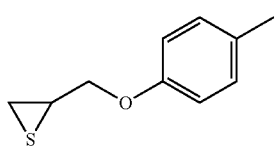
(B-49)
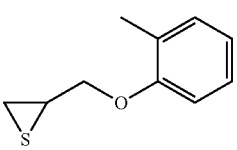
(B-50)
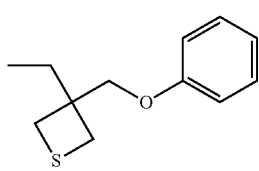
(B-51)
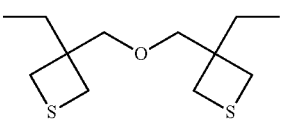

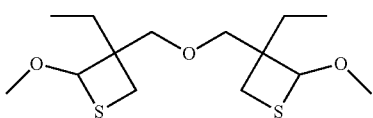
(B-52)

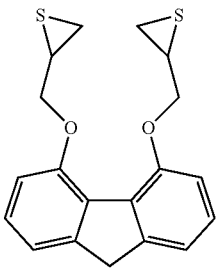
(B-53)

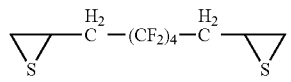
(B-54)

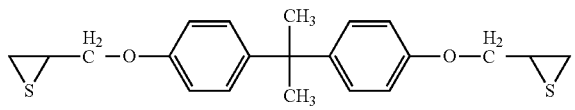
(B-55)

Further, it is preferred for the treating agent in the invention to contain an organic solvent for the purpose of controlling the solubility of a first resist pattern. As such an organic solvent, any solvent can be used so long as the solvent does not dissolve the first resist pattern and dissolves the compound represented by formula (1). Here, "does not dissolve the first resist pattern" means that when a line and space pattern of 200 nm of a film thickness of 0.2 μm is formed under the condition of 23° C. and immersed in the organic solvent at 23.5° C. for 10 minutes, the dimensional fluctuation and the height fluctuation of the pattern are both within ±0.5%.

Alcohol solvents, fluorine solvents and saturated hydrocarbon solvents are exemplified as such solvents, and the moisture content of the solvent is preferably 40 mol % or less, more preferably 10 mol % or less, and still more preferably 5 mol % or less.

As the alcohol solvents, monohydric alcohols are preferred in the points of environmental safety, preservation stability and safety to human body. They can be used by one kind alone, or in combination of two or more kinds.

The specific examples of the monohydric alcohols include methyl alcohol, ethyl alcohol, n-propyl alcohol, isopropyl alcohol, n-butyl alcohol, sec-butyl alcohol, tert-butyl alcohol, isobutyl alcohol, tert-pentyl alcohol, n-hexyl alcohol, n-heptyl alcohol, 2-heptyl alcohol, n-octyl alcohol, n-decanol, 3-methyl-3-pentanol, 2,3-dimethyl-2-pentanol, 4-phenyl-2-methyl-2-hexanol, 1-phenyl-2-methyl-2-propanol, s-amyl alcohol, t-amyl alcohol, isoamyl alcohol, 2-ethyl-1-butanol, etc.

In the above monohydric alcohols, the number of carbon atoms is preferably 5 or more from the viewpoint of volatility, and more preferably 7 or more. As the specific examples of the monohydric alcohols having 5 or more carbon atoms, tert-pentyl alcohol, n-hexyl alcohol, n-heptyl alcohol, 2-heptyl alcohol, n-octyl alcohol, n-decanol, 3-methyl-3-pentanol, 2,3-dimethyl-2-pentanol, and 2-ethyl-1-butanol are exemplified. As the specific examples of the monohydric alcohols having 7 or more carbon atoms, n-heptyl alcohol, 2-heptyl alcohol, n-octyl alcohol, n-decanol, 3-methyl-3-pentanol, 2,3-dimethyl-2-pentanol, and 2-ethyl-1-butanol are exemplified.

As the fluorine solvents, perfluoro-2-butyltetrahydro-furan, perfluorotetrahydrofuran, perfluorohexane, perfluoroheptane, perfluorotributylamine, perfluorotetrapentylamine, perfluorotetrahexylamine, etc., can be used. These solvents can be used by one kind alone, or two or more kinds as a mixture. In view of volatility, the carbon atom number of the fluorine solvents is preferably 7 or more, and more preferably 9 or more.

As the specific examples of the fluorine alcohols having 7 or more carbon atoms, perfluoro-2-butyltetrahydrofuran, perfluoroheptane, perfluorotributylamine, perfluoro-tetrapentylamine, perfluorotetrahexylamine, etc., are exemplified. As the specific examples of the fluorine alcohols having 9 or more carbon atoms, perfluorotributylamine, perfluorotetrapentylamine, perfluorotetrahexylamine, etc., are exemplified.

As the saturated hydrocarbon solvents, pentane, 2-methylbutane, 3-methylpentane, hexane, 2,2-dimethylbutane, 2,3-dimethylbutane, heptane, octane, 2,2,4-trimethylpentane, 2,2,3-trimethylhexane, decane, undecane, dodecane, 2,2,4,6,6-pentamethylheptane, tridecane, tetradecane, hexadecane, etc., can be used. These solvents can be used by one kind alone, or two or more kinds as a mixture. In view of volatility, the carbon atom number of the saturated hydrocarbon solvents is preferably 7 or more, and more preferably 9 or more. As the specific examples of the saturated hydrocarbon alcohols having 7 or more carbon atoms, heptane, octane, 2,2,4-trimethylpentane, 2,2,3-trimethylhexane, decane, undecane, dodecane, 2,2,4,6,6-pentamethylheptane, tridecane, tetradecane, hexadecane, etc., are exemplified.

As the specific examples of the saturated hydrocarbon alcohols having 9 or more carbon atoms, 2,2,3-trimethylhexane, decane, undecane, dodecane, 2,2,4,6,6-pentamethylheptane, tridecane, tetradecane, hexadecane, etc., are exemplified.

Organic solvents other than alcohol solvents, fluorine solvents and saturated hydrocarbon solvents may be used so long as they do not dissolve a first resist pattern and dissolve the compound represented by formula (1). These organic solvents are used in proportion of 80 mass % or more, and preferably 100 mass %.

As other solvents, one or two or more kinds can be arbitrarily selected and used from ester, ether, ketone, amide, aromatic hydrocarbon and cyclic ketone solvents. For example, esters such as ethyl lactate, ethyl acetate, butyl acetate, methyl methoxypropionate, etc., ethers such as monomethyl ethers, e.g., ethylene glycol monoacetate, diethylene glycol monoacetate, propylene glycol monoacetate, and dipropylene glycol monoacetate, monoethyl ethers, and monophenyl ethers, derivatives of these ethers, cyclic ethers, e.g., dioxane, and ketones, e.g., acetone, methyl ethyl ketone, cyclohexanone, and 2-heptanone can be exemplified.

The use amount of the organic solvents is not especially restricted so long as they can dissolve the compound represented by formula (1), but the amount is generally from 0 to 99 mass % based on the compound represented by formula (1), preferably from 5 to 95 mass %, and more preferably from 10 to 90 mass %.

Further, the treating agent in the invention may contain, if necessary, an acid, a compound capable of generating an acid by heating, or a base, for the purpose of accelerating the reaction with a first resist pattern.

As the acids to be added, acids having a low molecular weight, such as carboxylic acids and sulfonic acids can be used, and preferably low molecular weight acids such as partially fluorinated carboxylic acids and sulfonic acids are exemplified. Specifically, trifluorobutanesulfonic acid, heptafluoropropanesulfonic acid, perfluorobenzenesulfonic acid, etc., can be exemplified.

As the compounds capable of generating an acid by heating, various compounds known in this field can be used. For example, known compounds such as sulfonium salt type compounds, anilinium salt type compounds, pyridinium salt type compounds, phosphonium salt type compounds, and iodonium salt type compounds are exemplified. As the counter anions of these onium salt type compounds, $SbF_6^-$, $BF_4^-$, $AsF_6^-$, $PF_6^-$, toluenesulfonate, triflate, etc., can be exemplified. The temperature capable of generating an acid is generally 200° C. or less, and preferably 160° C. or less.

The addition amount of the acids and compounds capable of generating an acid by heating is generally from 0.01 to 20 mass % based on all the amount of the treating agent, and preferably from 0.1 to 10 mass %.

It is also preferred for the treating agent in the invention to contain various kinds of surfactants. Various surfactants known in this field can be used, for example, ionic and non-ionic fluorine and/or silicone surfactants can be used. These fluorine and/or silicone surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511 and 5,824,451. Commercially available surfactants shown below can also be used as they are.

As the bases to be added, bases having a low molecular weight, such as organic amines can be used, and preferably tertiary amines can be exemplified. Specifically, trimethylamine, triethylamine, tripropylamine, tributylamine, triethanolamine, triisopropylamine, triisobutylamine, diisopropylethylamine, 2,3'-(p-tolylamino)diethanol, diazabicycloundecene, diazabicyclononene, etc., are exemplified.

The addition amount of the bases and compounds capable of generating a base by heating is generally from 0.01 to 20 mass % based on all the amount of the treating agent, and preferably from 0.1 to 10 mass %.

As the commercially available fluorine or silicon surfactants usable in the invention, e.g., Eftop EF301 and EF303 (manufactured by Shin-Akita Kasei Co., Ltd.), Fluorad FC 430, 431 and 4430 (manufactured by Sumitomo 3M Limited), Megafac F171, F176, F189, and R08 (manufactured by Dainippon Ink and Chemicals Inc.), Sarfron S-382, SC 101, 102 and 103 (manufactured by ASAHI GLASS CO., LTD.), Troy Sol S-366 (manufactured by Troy Chemical Co., Ltd.), and PF6320 and PF6520 (manufactured by OMNOVA) can be exemplified.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized according to the method disclosed in JP-A-2002-90991.

In the invention, surfactants other than fluorine and/or silicone surfactants can also be used.

These surfactants may be used alone, or some surfactants may be used in combination.

The use amount of surfactants is preferably from 0.0001 to 2 mass % based on all the amount of the treating agent, and more preferably from 0.001 to 1 mass %.

By the addition of a surfactant to the treating agent, coating property at the time of coating the treating agent is improved.

The treating agent can further contain a photo-acid generator, a photo-sensitizer, a freezing reaction accelerator other than the above acids, a resin, etc., if necessary.

First Resist:

It is important in the invention, after forming a first resist pattern on a first resist film, to control the acid catalyst esterification reaction of the treating agent containing a polyhydric alcohol with the first resist to change the property of the first resist pattern so that the first resist pattern does not dissolve in a second resist solution. The esterification reaction can also be controlled not only by the change of the property of the treating agent but also by the change of the property of the first resist pattern and/or the processing condition at the time of the action of the treating agent.

The first resist may be either a positive resist or a negative resist, but a positive resist is preferably used for the purpose of improving the reactivity with the treating agent. Here, "a positive resist" means a resist the exposed part of which is dissolved in a developing solution, and "a negative resist" means a resist the unexposed part of which is dissolved in a developing solution. In the positive resist, in order to raise the solubility of the exposed part in a developing solution, chemical reaction such as polar conversion is utilized. On the other hand, the negative resist uses bonding formation between molecules such as crosslinking reaction and polymerization reaction.

It is preferred for the positive resist to contain resin (A) capable of decomposing by the action of an acid to thereby increase the solubility in an alkali developing solution, and a compound capable of generating an acid upon irradiation with actinic ray or radiation.

Resin (A) is preferably a resin capable of generating a carboxylic acid by chemical reaction in the process for forming a first resist pattern so as to cause esterification reaction with the treating agent containing a polyhydric alcohol and change the property of the first resist pattern so that the first resist pattern does not dissolve in a second resist solution. A resin containing a carboxylic acid may be contained in advance in the first resist before pattern formation.

It is preferred for resin (A) contained in the first resist pattern to have a group capable of decomposing by the action of an acid to thereby increase the solubility in an alkali developing solution (hereinafter also referred to as "an acid-decomposable group").

As the acid-decomposable group, a group in which the hydrogen atom of a carboxyl group is protected with a group that is desorbed by the action of an acid is preferably used, but groups other than the above group may be contained at the same time. As the groups that may be contained at the same time, groups in which the hydrogen atom of an alkali-soluble group, e.g., a hydroxyl group, a sulfonic acid group, or a thiol group, is protected with a group that is desorbed by the action of an acid can be exemplified.

The group that is desorbed by the action of an acid is preferably a group having a monocyclic or polycyclic alicyclic hydrocarbon structure. As such a group that is desorbed by the action of an acid, various groups known in this field can be used, and they are exemplified, e.g., in JP-2007-17889, JP-A-2006-215526, JP-A-2006-349996, etc.

It is preferred for resin (A) to further contain a resin having a carboxylic acid structure. As the group having a carboxylic acid structure, any group can be used so long as the group has a carboxylic acid structure.

It is preferred for resin (A) to further have a repeating unit containing a group having a lactone structure. As the group having a lactone structure, any group can be used so long as the group has a lactone structure, but preferably groups having 5 to 7-membered ring lactone structures, and 5- to 7-membered ring lactone structures condensed with other ring structures in the form of forming a bicyclo structure or a spiro structure are preferred. As the lactone group, various groups known in the field can be used, and they are exemplified, e.g., in JP-2007-17889, JP-A-2006-215526, JP-A-2006-349996, etc.

As other specific repeating units, considering dry etching resistance and alkali solubility, repeating units having a polar functional group such as a hydroxyl group, a cyano group, a carbonyl group, or an ester group, repeating units having a monocyclic or polycyclic hydrocarbon structure and not decomposable by the action of an acid, repeating units having a fluoroalkyl group, and repeating units comprising a plurality of these functional groups can be exemplified.

The specific examples of resins used in a first resist in the invention are shown below, but the invention is not restricted thereto.

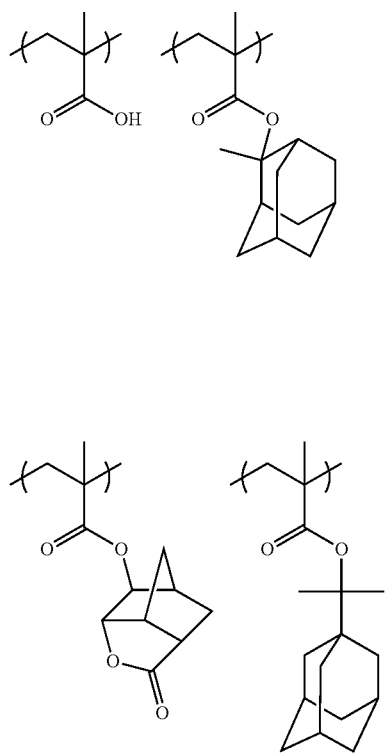

(RP-1)

(RP-2)

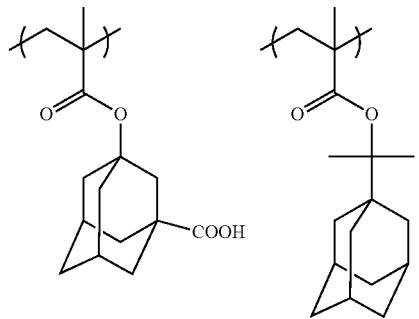

(RP-3)

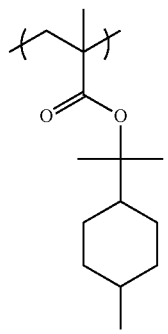

(RP-4)

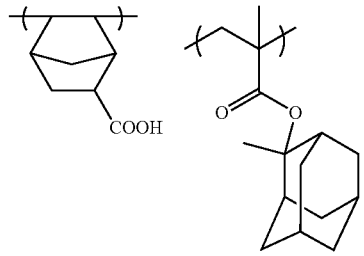

(RP-5)

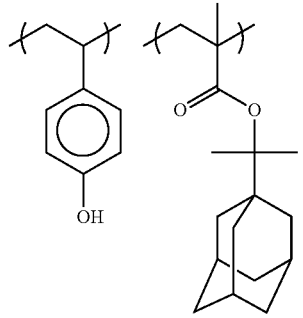

(RP-6)

(RP-7)

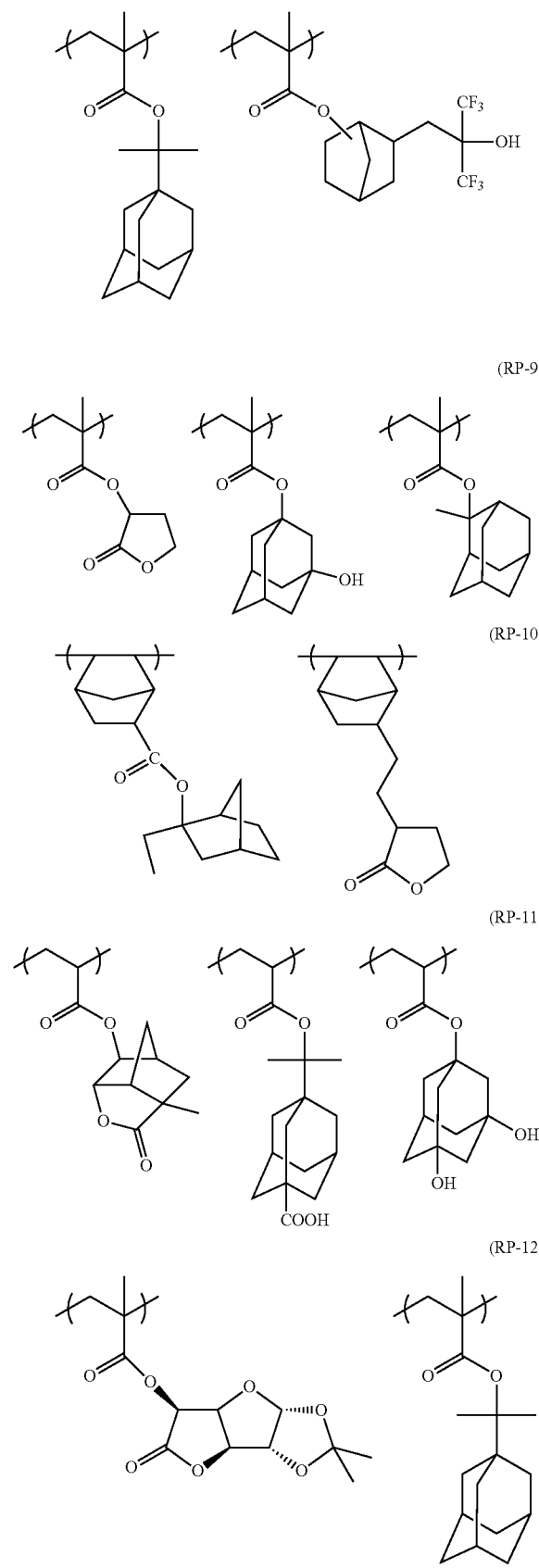
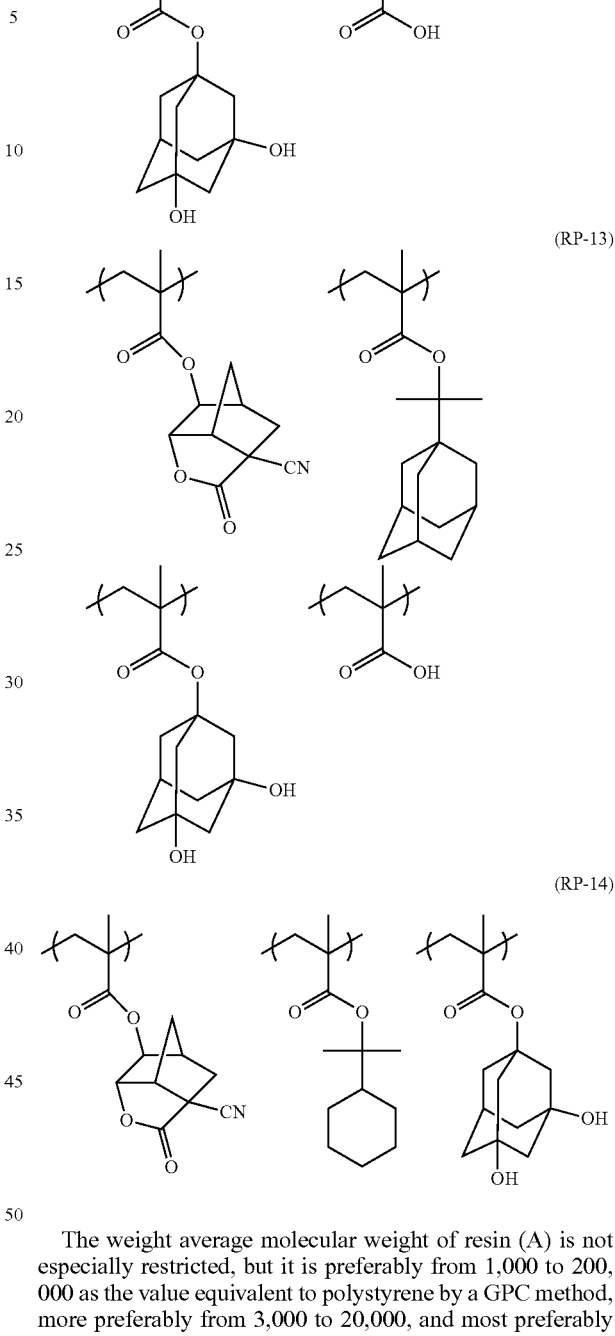

The weight average molecular weight of resin (A) is not especially restricted, but it is preferably from 1,000 to 200,000 as the value equivalent to polystyrene by a GPC method, more preferably from 3,000 to 20,000, and most preferably from 5,000 to 15,000.

The degree of dispersion of molecular weight (molecular weight distribution) of resin (A) is generally from 1 to 5, preferably from 1 to 3, more preferably from 1.2 to 3.0, and especially preferably from 1.2 to 2.0.

The blending amount of resin (A) is preferably from 50 to 99.9 mass % in all the solids content based on the solids content of the positive resist composition as a whole, and more preferably from 60 to 99.0 mass %.

In the invention, resin (A) may be used by one kind alone, or a plurality of kinds may be used in combination.

The positive resist contains a compound capable of generating an acid upon irradiation with actinic ray or radiation (also referred to as a photo-acid generator). As such photo-acid generators, photo-initiators of photo-cationic polymerization, photo-initiators of photo-radical polymerization, photo-decoloring agents and photo-discoloring agents of dyestuffs, well-known compounds capable of generating an acid upon irradiation with actinic ray or radiation that are used in micro-resists and the like, and the mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate can be exemplified.

Further, compounds obtained by introducing a group or a compound capable of generating an acid upon irradiation with actinic ray or radiation to the main chain or side chain of the polymer, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can also be used.

The compounds generating an acid by the action of lights as disclosed in U.S. Pat. No. 3,779,778, EP 126,712, etc., can also be used.

The photo-acid generators can be used by one kind alone, or two or more kinds of photo-acid generators can be used in combination.

The content of the photo-acid generator is preferably from 0.1 to 20 mass % based on all the solids content of the positive resist, more preferably from 0.5 to 10 mass %, and still more preferably from 1 to 7 mass %.

For reducing the fluctuation of performances due to aging from exposure to heating, it is preferred for the positive resist in the invention to contain a basic compound.

Compounds known in the field can be arbitrarily used as the basic compound, but preferably the compounds having a partial structure represented be any of the following formulae (A) to (E) can be exemplified.

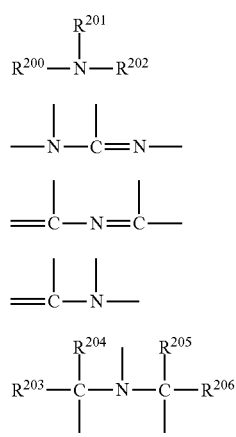

In formulae (A) to (E), $R^{200}$, $R^{201}$ and $R^{202}$, which may be the same or different, each represents a hydrogen atom, an alkyl group (preferably having from 1 to 20 carbon atoms), a cycloalkyl group (preferably having from 3 to 20 carbon atoms), or an aryl group (having from 6 to 20 carbon atoms), and $R^{201}$ and $R^{202}$ may be bonded to each other to form a ring.

$R^{203}$, $R^{204}$, $R^{205}$ and $R^{206}$, which may be the same or different, each represents an alkyl group having from 1 to 20 carbon atoms.

These basic compounds can be used by one kind alone, or two or more kinds can be used in combination.

The use amount of the basic compound is generally from 0.001 to 10 mass % based on all the solids content of the positive resist, and preferably from 0.01 to 5 mass %.

It is preferred for the positive resist in the invention to further contain resin (B) having at least either a fluorine atom or a silicon atom.

The fluorine atom or silicon atom in resin (B) may be introduced to the main chain of the resin or may be substituted on the side chain.

Resin (B) is preferably a resin having an alkyl group having a fluorine atom, a cycloalkyl group having a fluorine atom, or an aryl group having a fluorine atom as the partial structure having a fluorine atom.

When resin (B) has a fluorine atom, the content of the fluorine atom is preferably from 5 to 80 mass % based on the molecular weight of resin (B), and more preferably from 10 to 80 mass %. It is preferred that the repeating unit containing a fluorine atom account for 10 to 100 mass % in resin (B), and more preferably from 30 to 100 mass %.

Resin (B) is preferably a resin having an alkylsilyl structure (preferably a trialkylsilyl group), or a cyclic siloxane structure as the partial structure having a silicon atom.

When resin (B) has a silicon atom, the content of the silicon atom is preferably from 2 to 50 mass % based on the molecular weight of resin (B), and more preferably from 2 to 30 mass %. It is preferred that the repeating unit containing a silicon atom account for 10 to 100 mass % in resin (B), and more preferably from 20 to 100 mass %.

The specific examples of resin (B) are shown below, but the invention is not restricted thereto.

In the following (T-01) and (T-04), X represents a hydrogen atom, a methyl group, a fluorine atom, or a trifluoromethyl group.

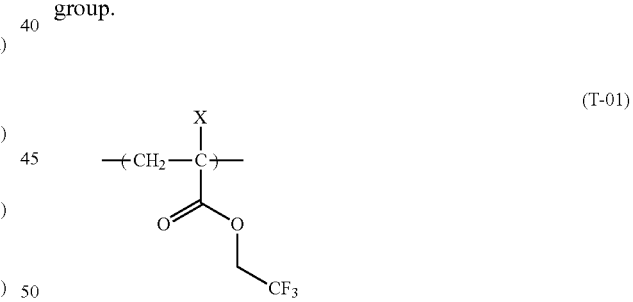

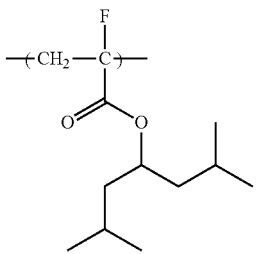

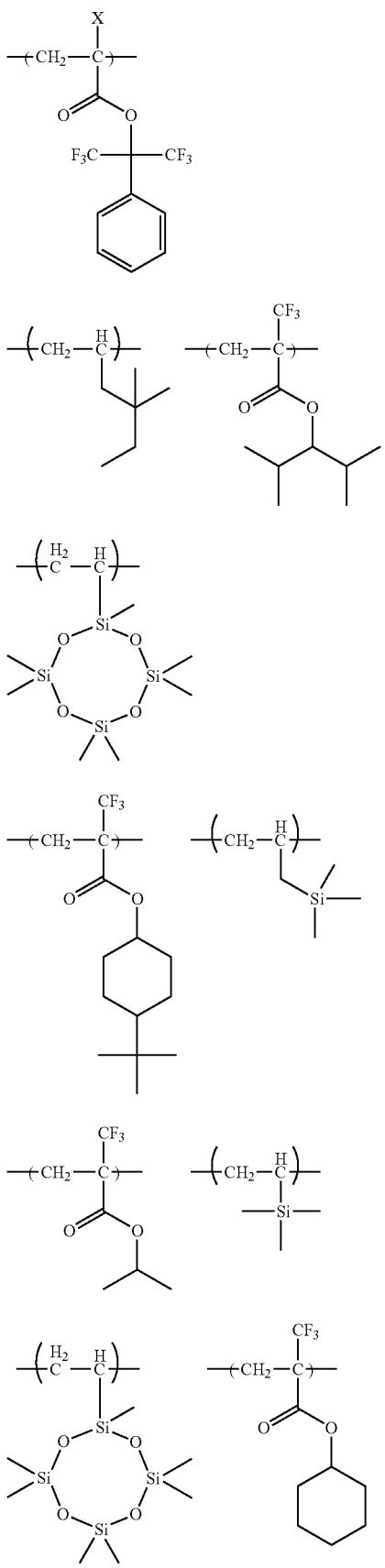

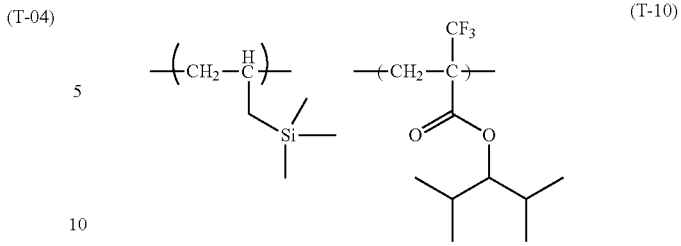

It is preferred that resin (B) is stable to an acid and insoluble in an alkali developing solution.

It is preferred for resin (B) not to have (x) an alkali-soluble group, (y) a group capable of decomposing by the action of an alkali (an alkali developing solution) to thereby increase solubility in an alkali developing solution, and (z) a group capable of decomposing by the action of an acid to thereby increase solubility in a developing solution, in the point of the following ability of an immersion liquid.

The total content of a repeating unit having the alkali-soluble group or the group capable of increasing solubility in a developing solution by the action of an acid or alkali in resin (B) is preferably 20 mol % or less based on all the repeating units constituting resin (B), more preferably from 0 to 10 mol %, and still more preferably from 0 to 5 mol %.

Unlike the surfactants ordinarily used in resists, resin (B) does not have an ionic bond and a hydrophilic group such as poly(oxyalkylene) group and the like. When resin (B) has a hydrophilic polar group, the following ability of an immersion liquid is liable to lower, so that it is more preferred not to have a polar group selected from a hydroxyl group, alkylene glycols, and a sulfone group. Further, an ether group bonding to the carbon atom of the main chain via a linking group increases hydrophilicity to degrade the following ability of an immersion liquid, so that it is preferred not to have such a group. On the other hand, there are cases where an ether group directly bonding to the carbon atom of the main chain can exhibit hydrophobicity, so that such an ether group is preferred.

The weight average molecular weight of standard polystyrene equivalent of resin (B) is preferably from 1,000 to 100,000, more preferably from 1,000 to 50,000, still more preferably from 2,000 to 15,000, and especially preferably from 3,000 to 15,000.

The residual amount of monomers of resin (B) is preferably from 0 to 10 mass %, more preferably from 0 to 5 mass %, and still more preferably from 0 to 1 mass %. In view of resolution, a resist form, the sidewalls of a resist pattern and roughness, the molecular weight distribution (Mw/Mn, also referred to as the degree of dispersion) of resin (B) is preferably from 1 to 5, more preferably from 1 to 3, and still more preferably from 1 to 1.5.

The addition amount of resin (B) in a positive resist composition is preferably from 0.1 to 20 mass % based on all the solids content of the resist composition, more preferably from 0.1 to 10 mass %, still more preferably from 0.1 to 5 mass %, still further preferably from 0.2 to 3.0 mass %, and still further yet preferably from 0.3 to 2.0 mass %.

Various kinds of commercially available products can be used as resin (B), and can also be synthesized according to ordinary methods (e.g., radical polymerization).

The positive resist in the invention can further contain, if necessary, resins other than those described above, acid-decomposable and dissolution-inhibiting compounds, dyes, plasticizers, photo-sensitizers, light absorbers, and compounds for accelerating solubility in a developing solution.

The positive resist in the invention is formed by dissolution of the above-described components in an ordinary solvent. As the solvents, optional solvents such as alcohol, ketone, ether, ester, halogenated hydrocarbon, cyclic ketone, and cyclic ether solvents can be used, but solvents that can be preferably used are solvents having a boiling point of 130° C. or more under ordinary temperature and atmospheric pressure. The specific examples of such solvents include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

It is especially preferred that the solvent for use in the invention be a mixed solvent of two or mode kinds containing propylene glycol monomethyl ether acetate.

Second Resist:

The similar resist to the first resist can be used as a second resist used for forming a second resist pattern. From the viewpoint of making the dry etching resistance of the first resist pattern and that of the second resist pattern the same, it is preferred that a resin for use in the second resist should be substantially the same as the resin for use in the first resist. Further, it is most preferred that the first resist and the second resist consist of completely the same resist for the first resist and the second resist to form the patterns of substantially the same properties to actual semiconductor device masks having patterns of various dimensions and shapes.

The estrification reaction of the treating agent containing polyhydric alcohol with the first resist can also be controlled by the change of the processing condition in activating the treating agent.

The processes used for forming a first resist pattern, in freezing by the chemical treatment of the first resist pattern, and formation of a second resist pattern are described below.

Formation of the First Resist Pattern:

In the invention, a first resist composition is filtered and then coated on a prescribed support as follows. The filters for use in filtration are preferably polytetrafluoroethylene, polyethylene and nylon filters having a pore size of 0.1 μm or less, more preferably 0.05 μm or less, and still more preferably 0.03 μm or less.

For example, the resist composition is coated on such a substrate as used in the production of precision integrated circuit elements (e.g., silicon/silicon dioxide coating) according to an appropriate coating method with a spinner or coater, and dried to form a resist film.

Prior to formation of a resist film, an antireflection film may be coated on a substrate in advance.

As the antireflection film, inorganic film types, e.g., titanium, titanium dioxide, titanium nitride, chromium oxide, carbon, amorphous silicon, etc., and organic film types comprising a light absorber and a polymer material are exemplified, and any of these materials can be used. As the organic antireflection films, commercially available organic antireflection films such as DUV-30 series and DUV-40 series (manufactured by Brewer Science), AR-2, AR-3 and AR-5 (manufactured by Shipley Company LLC), etc., can be used.

Dry Exposure System:

The resist film is then irradiated with actinic ray or radiation through a prescribed mask, and the exposed film is preferably subjected to baking (heating), development and rinsing, whereby a good pattern can be obtained.

As the actinic rays or radiation, infrared rays, visible rays, ultraviolet rays, far ultraviolet rays, X-rays and electron beams can be exemplified, preferably far ultraviolet rays of wavelengths of 250 nm or less, more preferably 220 nm or less, and especially preferably from 1 to 200 nm are exemplified. Specifically, an ArF excimer laser, an $F_2$ excimer laser, EUV (13 nm), and electron beams are preferably used.

Immersion Exposure:

In the case of immersion exposure, the resist film is subjected to exposure (immersion exposure) via an immersion liquid through a mask or the like for forming a pattern. For example, exposure is performed in the state of filling the immersion liquid between the resist film and an optical lens. After exposure, if necessary, the resist film is washed with the immersion liquid. Subsequently, the immersion liquid is removed preferably by spinning. As the actinic rays or radiation, infrared rays, visible rays, ultraviolet rays, far ultraviolet rays, X-rays and electron beams can be exemplified, preferably far ultraviolet rays of wavelengths of 250 nm or less, more preferably 220 nm or less, and especially preferably from 1 to 200 nm. Specifically, an ArF excimer laser, an $F_2$ excimer laser, EUV (13 nm), and electron beams are preferably used.

The immersion liquids for use in immersion exposure are described below.

The immersion liquid for use in immersion exposure is transparent to the exposure wavelength and preferably has a temperature coefficient of refractive index as small as possible so as to hold the distortion of an optical image projected on the resist to the minimum. In particular, when the exposure light source is an ArF excimer laser (wavelength: 193 nm), it is preferred to use water as the immersion liquid for easiness of availability and easy handling property, in addition to the above points of view.

Further, in view of the improvement of refractive index, a medium having a refractive index of 1.5 or more can also be used, e.g., an aqueous solution and an organic solvent can be used as the medium.

When water is used as the immersion liquid, to reduce the surface tension of water and to increase the surface activity, a trace amount of additive (a liquid) that does not dissolve the resist layer on a wafer and has a negligible influence on the optical coating of the lower surface of a lens element may be added. As such an additive, an aliphatic alcohol having a refractive index almost equivalent to the refractive index of water is preferred, specifically methyl alcohol, ethyl alcohol and isopropyl alcohol are exemplified.

A film hardly soluble in an immersion liquid (hereinafter also referred to as "topcoat") may be provided between a resist film and an immersion liquid in order to prevent the resist film from touching the immersion liquid directly. The necessary functions required of a topcoat are the aptitude for coating on the upper layer of a resist, the transparency to radiation, particularly the transparency to the light of 193 nm, and the insolubility in an immersion liquid. It is preferred that a topcoat is not mixed with a resist and capable of being coated uniformly on the upper layer of a resist.

From the viewpoint of the transparency to 193 nm, polymers not containing aromatic groups are preferably used as the topcoat. Specifically, hydrocarbon polymers, acrylic acid ester polymers, polymethacrylic acid, polyacrylic acid, polyvinyl ether, silicon-containing polymers and fluorine-containing polymers are exemplified.

When a topcoat is peeled, a developing solution may be used, or a remover may be used separately. As the remover, solvents low in osmosis into a resist are preferred. In view of capable of performing peeling process at the same time with the development process of a resist, peeling by an alkali developing solution is preferred. From the viewpoint of performing peeling by an alkali developing solution, the topcoat is preferably acidic, but from the point of non-intermixture with a resist, the topcoat may be neutral or alkaline.

After the dry exposure and immersion exposure, the exposed film is preferably subjected to baking (heating), development and rinsing, whereby a good pattern can be obtained.

In a development process, an alkali developing solution is used as follows. As the alkali developing solution of a resist composition, alkaline aqueous solutions of inorganic alkalis, e.g., sodium hydroxide, potassium hydroxide, sodium carbonate, sodium silicate, sodium metasilicate, and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanol-amine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to the above alkali developing solutions.

The alkali concentration of the alkali developing solutions is generally from 0.1 to 20 mass %.

The pH of the alkali developing solutions is generally from 10.0 to 15.0.

Pure water can be used as a rinsing liquid and an appropriate amount of surfactants may be added thereto.

After the development process or rinsing process, a process to remove the developing solution or rinsing liquid adhered on the pattern can be performed by supercritical fluid.

Further, after the rinsing process or process by supercritical fluid, heating process can be performed for removing the moisture content remaining in the pattern.

Chemical Treatment of the First Resist Pattern:

After the formation of the first resist pattern by the above method, the first resist pattern is subjected to chemical treatment with the treating agent of the invention.

The process of chemical treatment is performed in the order as follows. In the first place, the treating agent is permeated into the first resist pattern, chemical reaction is caused between the permeated treating agent and the resin present in the resist pattern, the excess treating agent remaining on the substrate is removed by rinsing according to necessity, and further, if necessary, the rinsing liquid penetrated into the resist pattern is eliminated.

As the method of permeating the treating agent into the first resist pattern, a method of immersing the substrate having the first resist pattern formed thereon in the solution of treating agent, and a method of coating the solution of treating agent on the substrate on which the first resist pattern is formed are exemplified.

As the method of immersing the substrate on which the first resist pattern is formed in the solution of treating agent, a method of immersing the substrate in the solution of treating agent, and a method of puddling the solution of treating agent on a substrate on a coating apparatus (liquid film formation) are exemplified.

When the substrate is immersed in the solution of treating agent, the solution of treating agent may be heated in advance, but the substrate is preferably immersed at 50° C. or less in order to prevent the solution of treating agent from evaporating. It is most preferred to perform immersion at a temperature of the solution of treating agent in the range of from 20 to 25° C.

The time of immersion in the case of immersion of the substrate in the solution of treating agent is preferably longer for the purpose of penetrating the treating agent into the first resist pattern. Taking the throughput of the process into consideration, the time is preferably from 20 to 120 seconds, more preferably from 30 to 90 seconds, and still more preferably from 30 to 60 seconds.

As the method of coating the solution of treating agent on the substrate on which the first resist pattern is formed, a method of coating the solution of treating agent on a coating apparatus is exemplified.

It is sufficient that the temperature in the case of coating the solution of treating agent on the substrate is from room temperature to the temperature of not evaporating the solution of treating agent, but preferably the solution is coated at 20 to 25° C.

As the method of coating, e.g., spin coating is exemplified.

In the case of spin coating, the solution of treating agent is ejected from a nozzle while rotating a substrate. The number of revolution of the substrate at that time is preferably from 50 to 2,000 rpm, more preferably from 100 to 1,500 rpm, and most preferably from 100 to 1,000 rpm. The ejection rate of the solution of treating agent at the time of spin coating is preferably from 0.2 to 10 ml/sec, more preferably from 0.5 to 5 ml/sec, and most preferably from 0.7 to 3 ml/sec. The ejection time of the solution of treating agent at the time of spin coating is preferably from 20 to 120 sec, more preferably from 30 to 90 sec, and most preferably from 30 to 60 sec. It is preferred for the substrate to keep rotation at the above number of rotation while the solution of treating agent is ejected.

In any of the case of immersing the substrate in the solution of treating agent and the case of coating the solution of treating agent on the substrate, it is preferred to shake off the solution of treating agent by rotating the substrate in order to eliminate the excess solution of treating agent remaining on the substrate. The number of rotation of the substrate in shaking off is preferably 1,000 rpm or more, and the time of rotation at that time is preferably 10 seconds or more.

The chemical reaction between the permeated treating agent and the resin present in the resist pattern advances at room temperature, but generally reaction efficiency increases by heating. It is preferred to use a hot plate generally annexed to a coating-developing apparatus, since all the process of the chemical treatment can be carried out in a coating-developing apparatus.

The chemical treatment does not advance sufficiently when the temperature is too low, while there is the possibility of deformation of the resist pattern when the temperature is too high, so that the heating temperature is preferably from 60 to 200° C., more preferably from 80 to 180° C., and most preferably from 100 to 160° C. Too short a heating time results in insufficient advancement of the chemical reaction, while too long a heating time affects the throughput of the process, so that the heating time is preferably from 30 to 120 sec, and more preferably from 40 to 100 sec.

After the heating process, the substrate is preferably cooled to room temperature and fed into the next process.

As the method of removing the excess solution of treating agent remaining on the substrate, a method of ejecting a rinsing liquid by rotating the substrate with a coating apparatus is exemplified.

The solvent used in the solution of treating agent is preferably used in the rinsing solution, but any solvent can be used so long as the solvent does not dissolve the first resist pattern.

The number of rotation of the substrate in rinsing is preferably from 50 to 2,000 rpm, more preferably from 100 to 1,500 rpm, and most preferably from 100 to 1,000 rpm. Further, the ejection rate of the rinsing liquid at the time of rinsing is preferably from 0.2 to 10 ml/sec, more preferably from 0.5 to 5 ml/sec, and most preferably from 0.7 to 3 ml/sec. The ejection time of the rinsing liquid at the time of rinsing is preferably from 20 to 120 sec, more preferably from 30 to 90 sec, and most preferably from 30 to 60 sec. It is preferred for the substrate to keep rotation at the above number of rotation while the rinsing liquid is ejected.

After rinsing, it is preferred to shake off the rinsing liquid by rotating the substrate in order to eliminate the excess rinsing liquid remaining on the substrate. The number of rotation of the substrate in shaking off is preferably 1,000 rpm or more, and the time of rotation at that time is preferably 10 seconds or more.

As the method for removing the rinsing liquid penetrated into the resist pattern, heating is exemplified.

It is preferred to use a hot plate generally annexed to a coating-developing apparatus, since all the process of the chemical treatment can be carried out in a coating-developing apparatus.

The removal of the rinsing liquid does not advance sufficiently when the temperature is too low, while there is the possibility of deformation of the resist pattern when the temperature is too high, so that the heating temperature is preferably from 60 to 200° C., more preferably from 80 to 180° C., and most preferably from 100 to 160° C.

For the purpose of the increment of efficacy of the chemical reaction, after formation of the first resist pattern, the first resist pattern may be subjected to exposure free of a mask, and further, heating to generate a carboxylic acid that is the base of the chemical reaction.

The exposure light source in this case is most preferably the exposure light source used in the formation of the first resist pattern, but any exposure light source may be used so long as the exposure light source is capable of decomposing the photo-acid generator present in the first resist pattern to generate an acid.

The quantity of exposure is not especially restricted so long as the photo-acid generator can be decomposed, but the quantity is preferably from 5 to 20 mJ/cm$^2$.

The generation of carboxylic acids does not advance sufficiently when the heating temperature after exposure is too low, while there is the possibility of deformation of the resist pattern when the temperature is too high, so that the heating temperature is preferably from 50 to 150° C., more preferably from 60 to 140° C., and most preferably from 80 to 130° C.

Formation of the Second Resist Pattern:

In the invention, a second resist composition is filtered and then coated on the substrate on which the chemically treated first resist pattern is formed. The filters for use in filtration are preferably polytetrafluoroethylene, polyethylene and nylon filters having a pore size of 0.1 μm or less, more preferably 0.05 μm or less, and still more preferably 0.03 μm or less.

Coating is carried out in the similar method to the method used in the formation of the first resist pattern, and the second resist composition is coated according to an appropriate coating method with a spinner or coater, and dried to form a resist film. A resist pattern after coating can be formed in the same process and method as used in the first resist pattern.

Example

The invention will be specifically described with reference to examples, but the invention is not restricted thereto.

The structures of the resins used are shown below. Regarding each resin, the molar ratios of repeating units (in order from the left hand), weight average molecular weights (Mw), and the degrees of dispersion (Mw/Mn) are shown in Table 1 below.

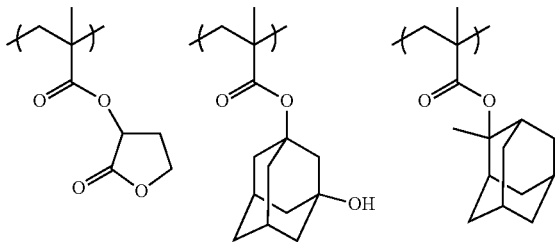

(1)

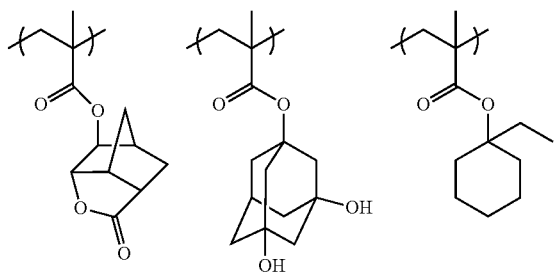

(2)

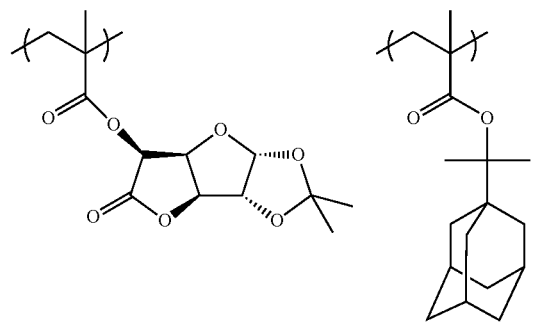

(3)

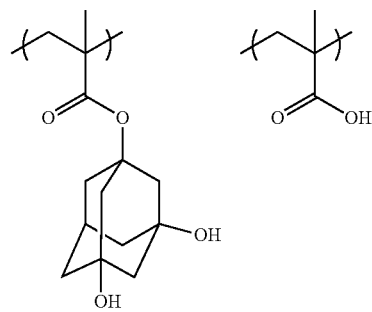

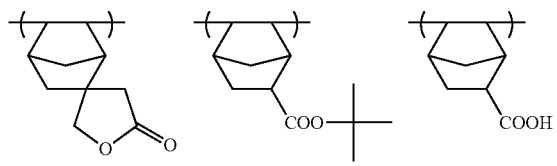

(4)

-continued

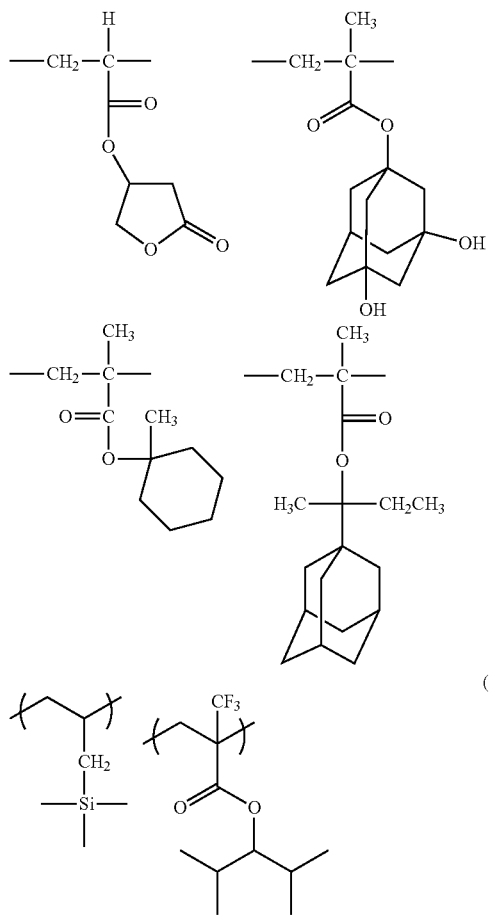

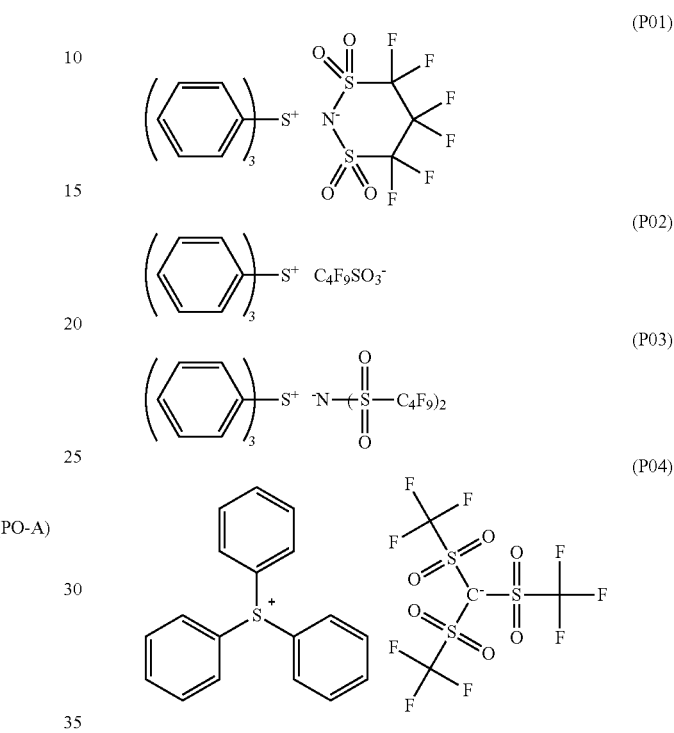

TABLE 1

| Resin | Composition (molar ratio) | Mw | Mw/Mn |
|---|---|---|---|
| (1) | 50/10/40 | 8,800 | 1.8 |
| (2) | 40/22/38 | 12,000 | 2.3 |
| (3) | 46/32/12/10 | 6,500 | 2.1 |
| (4) | 18/69/13 | 11,000 | 1.8 |
| (5) | 39/21/11/29 | 9,600 | 1.7 |
| (PO-A) | 50/50 | 5,000 | 1.4 |

Synthesis of Resin (1):

Under nitrogen current, 20 g of a mixed solvent comprising propylene glycol monomethyl ether acetate and propylene glycol monomethyl ether in a mass ratio of 6/4 is put in a three-neck flask and heated at 80° C. (solvent 1). Butyrolactone methacrylate, hydroxyadamantane methacrylate and 2-methyl-2-adamantyl methacrylate in a molar ratio of 50/10/40 are dissolved in the mixed solvent comprising propylene glycol monomethyl ether acetate and propylene glycol monomethyl ether in a mass ratio of 6/4 to prepare 200 g of a 22 mass % monomer solution. Further, an initiator V-601 (manufactured by Wako Pure Chemical Industries Ltd.) in proportion of 8 mol % to the monomer is added and dissolved, and the resulting solution is dropped to solvent 1 over 6 hours. After termination of dropping, the reaction solution is reacted for further 2 hours at 80° C. After being allowed to cool, the reaction solution is poured into hexane/ethyl acetate (1,800 ml/200 ml), precipitated powder is filtered and dried to obtain 37 g of resin (1). The weight average molecular weight of resin (1) obtained is 8,800, and the degree of dispersion (Mw/Mn) is 1.8.

Resins (2), (3), (4), (5) and (PO-A) are synthesized in the same manner.

The abbreviations in each table are as follows.

Basic Compounds:
TPI: 2,4,5-Triphenylimidazole
PEA: N-Phenyldiethanolamine
DPA: 2,6-Diisopropylphenyl alcohol
PBI: 2-Phenylbenzimidazole
Surfactants:
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
Solvents:
A1: Propylene glycol monomethyl ether acetate
A2: γ-Butyrolactone
A3: Cyclohexanone
B1: Propylene glycol monomethyl ether
B2: Ethyl lactate
C1: tert-Butanol
C2: 2,3-Dimethyl-2-pentanol
C3: Perfluoro-2-butyltetrahydrofuran
C4: Perfluorohexane
C5: Decane
C6: Octane
Preparation of Resist:

The components of each sample shown in Table 2 below are dissolved in the solvent to prepare a solution having the concentration of solids content of 5.8 mass %, and each solution is filtered through a polyethylene filter having a pore size of 0.1 μm to prepare a positive resist solution. Regarding each component in Table 2, the ratio in the case where two or more components are used is a mass ratio.

TABLE 2
| Resist No. | (a) Resin (10 g) | (b) Acid Generator (g) | (c) Basic Compound (g) | (d) Surfactant (g) | (e) Additive (g) | Solvent (mass ratio) |
|---|---|---|---|---|---|---|
| Ar-01 | 1 | P01 (0.3) | TPI (0.03) | W-3 (0.01) | PO-A (0.01) | A1/B1 (70/30) |
| Ar-02 | 2 | P02 (0.2) | PEA (0.03) | W-2 (0.02) | PO-A (0.50) | A1/A2 (40/60) |
| Ar-03 | 3 | P03 (0.4) | PBI (0.02) | W-1 (0.01) | PO-A (1.00) | A1/B2 (50/50) |
| Ar-04 | 4 | P01 (0.2) | TPI (0.03) | W-2 (0.02) | PO-A (5.00) | A1/A3 (60/40) |
| Ar-05 | 5 | P04 (0.3) | DPA (0.03) | W-1 (0.01) | PO-A (2.00) | B1/B2 (70/30) |
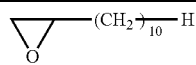
(FG-01)
Mol. Wt.: 184.3
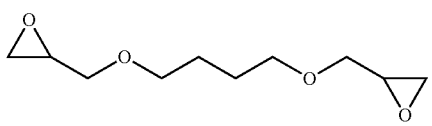
(FG-02)
Mol. Wt.: 202.25
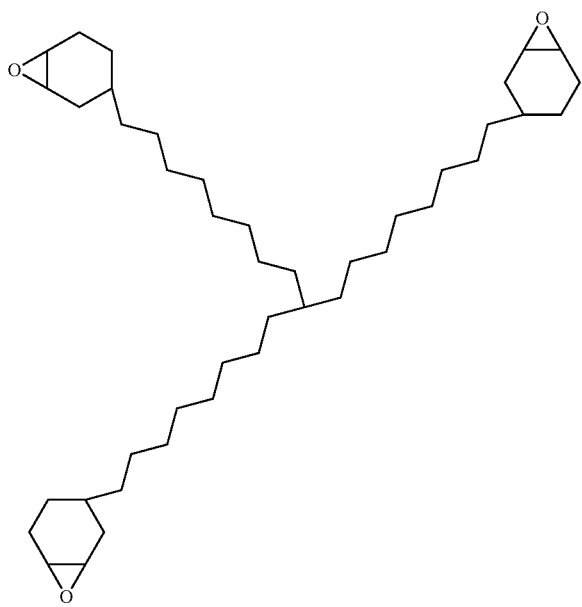
(FG-03)
Mol. Wt.: 641.1
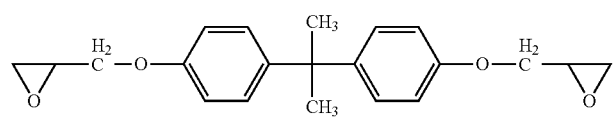
(FG-04)
Mol. Wt.: 340.4
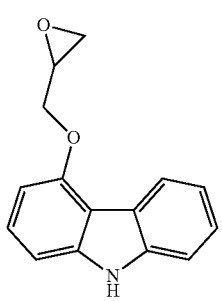
(FG-05)
Mol. Wt.: 239.3

TABLE 2-continued
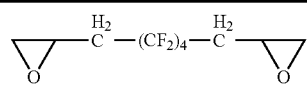
Mol. Wt.: 314.2
(FG-06)
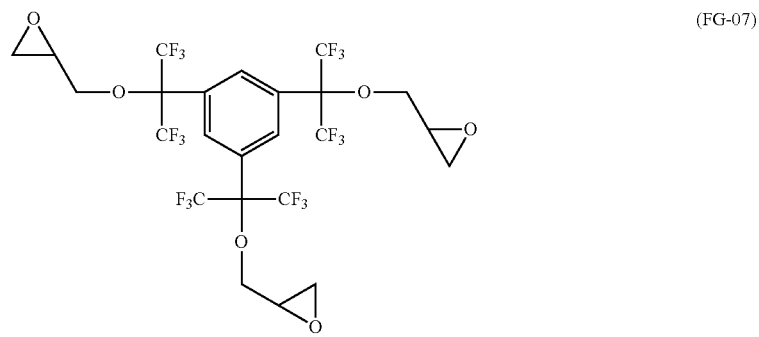
Mol. Wt.: 744.4
(FG-07)
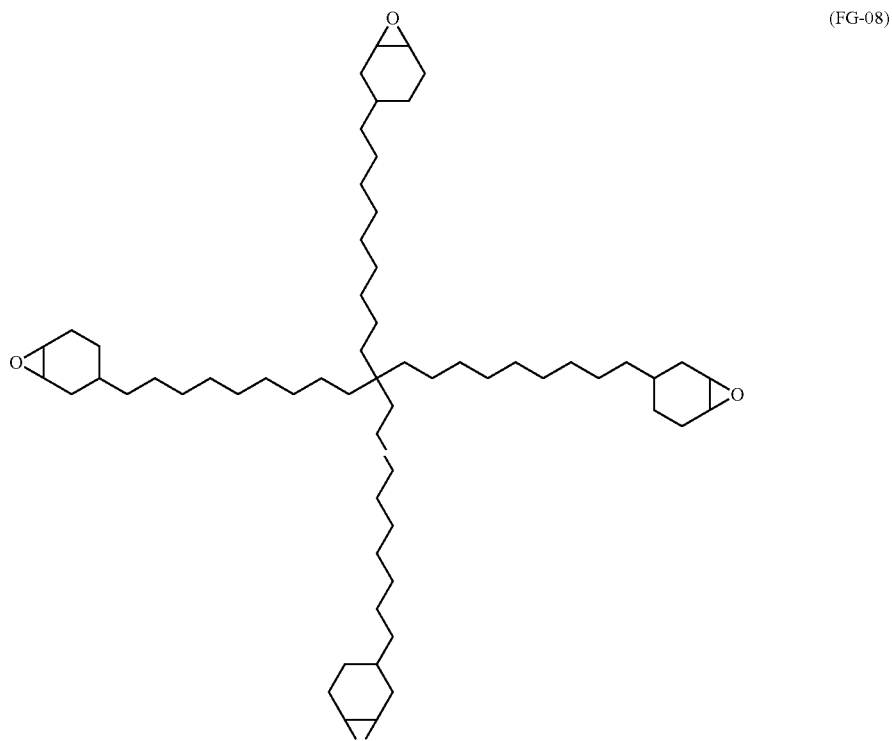
Mol. Wt.: 905.5
(FG-08)
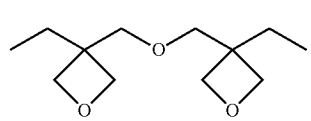
Mol. Wt.: 214.3
(FG-09)
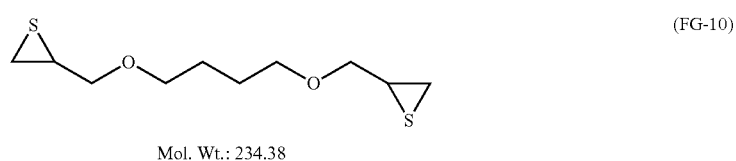
Mol. Wt.: 234.38
(FG-10)

FG-07 is synthesized according to the method described in Journal of Fluorine Chemistry, 44 (2), 203-10 (1989).

FG-10 is synthesized from FG-02 according to the method shown in the above Scheme 1.

Commercially available products are used as others (commercially available products from Tokyo Chemical Industry Co., Ltd., Daicel Chemical Industries, Daikin Industries Ltd., and Toagosei Co., Ltd.).

Additives:

$C_3F_7SO_3H$ (X01)

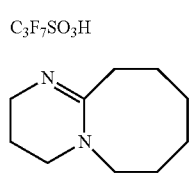
(Y01)

Preparation of Freezing Treating Agent:

A freezing treating agent is obtained by dissolving the components shown in Table 3 below in the solvent and filtering through a polyethylene filter having a pore size of 0.1 μm.

TABLE 3

| No. of Treating Agent | Composition | | | |
|---|---|---|---|---|
| | (h) Compound (g) | (i) Additive (g) | (j) Surfactant (g) | Solvent (g) |
| F-01 | FG-01 (5) | None | W-3 (0.01) | C1/C6 (40/55) |
| F-02 | FG-02 (10) | None | None | C2/C5 (70/30) |
| F-03 | FG-03 (10) | None | W-1 (0.01) | C3 (90) |
| F-04 | FG-04 (20) | None | W-2 (0.01) | C2 (80) |
| F-05 | FG-05 (5) | None | W-1 (0.01) | C2/C5 (70/30) |
| F-06 | FG-06 (10) | None | W-3 (0.02) | C3 (90) |
| F-07 | FG-07 (10) | None | W-3 (0.02) | C4 (90) |
| F-08 | FG-08 (10) | None | W-3 (0.02) | C1 (90) |
| F-09 | FG-05 (5) | X01 (0.01) | W-1 (0.01) | C2/C5 (70/30) |
| F-10 | FG-05 (5) | Y01 (0.01) | W-1 (0.01) | C2/C5 (70/30) |
| F-11 | FG-09 (10) | None | W-1 (0.01) | C1 (90) |
| F-12 | FG-10 (10) | None | W-1 (0.01) | C1 (90) |

The prepared solution of treating agent and the positive resist solution are evaluated according to the following methods.

Method of Evaluation:

ArF Dry Exposure:

A method for forming a pattern subjected to freezing treatment is described below with reference to FIGS. 1A to 1L.

FIG. 1A:

An organic antireflection film ARC29A (manufactured by Nissan Chemical Industries, Ltd.) is coated on a silicone wafer, and baked at 205° C. for 60 seconds to form antireflection film 4 having a thickness of 78 nm. The prepared first positive resist composition is coated thereon, and baked at 115° C. for 60 seconds to form first resist film 1 having a thickness of 160 nm.

Figure 1B:
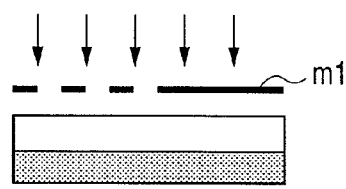
Figure 1C:
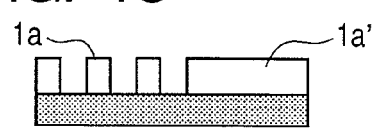

FIGS. 1B and 1C:

The wafer having coated thereon first resist film 1 is subjected to pattern exposure with an ArF excimer laser scanner (PAS 5500/1100, NA: 0.75, manufactured by ASML) through exposure mask m1. After that, the wafer is heated at 115° C. for 60 seconds, and then subjected to development with a tetramethylammonium hydroxide aqueous solution (2.38 mass %) for 30 seconds, rinsing with pure water, and spin drying to thereby obtain first resist patterns 1a and 1a' having a pitch of 180 nm and a line width of 90 nm.

Figure 1D:
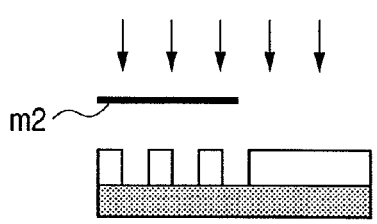
Figure 1E:
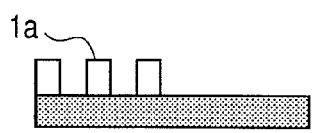

FIGS. 1D and 1E:

In the next place, the pattern is subjected to exposure with the above ArF excimer laser scanner at a quantity of exposure of 30 mJ/cm² through exposure mask m2 so that 1a' part of the first resist pattern is entirely exposed. After that, the pattern is heated at 115° C. for 60 seconds, and then subjected to development with a tetramethylammonium hydroxide aqueous solution (2.38 mass %) for 30 seconds, rinsing with pure water, and spin drying to completely remove the resist film of resist pattern 1a' so that only first resist pattern 1a remains on the water coated with the organic antireflection film.

Figure 1F:
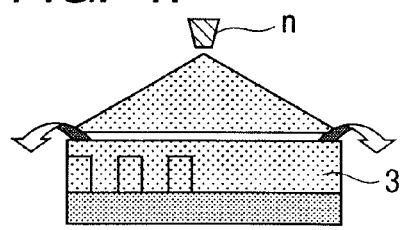
Figure 1G:
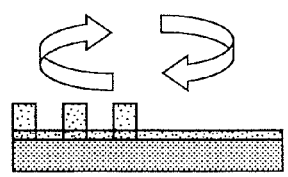
Figure 1H:
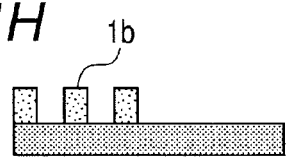

FIGS. 1F to 1H:

Subsequently, while rotating the wafer having first resist pattern 1a at 500 rpm, treating agent 3 is ejected from nozzle n at a flow rate of 2 ml/sec for 60 seconds, and then the wafer is rotated at 2,000 rpm for 60 seconds to completely shake off the treating agent. In the next place, baking at 130° C. for 90 seconds is performed to advance the reaction, and then the wafer is subjected to cooling to room temperature, rinsing with 2-heptanol for 20 seconds to form first pattern 1b having been subjected to freezing treatment with the treating agent.

Figure 1I:
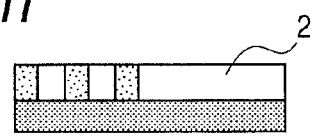
Figure 1J:
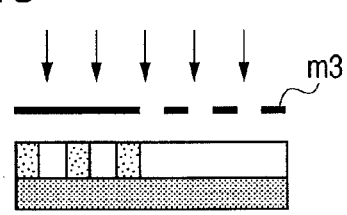

FIGS. 1I and 1J:

The prepared second positive resist composition is coated on the wafer having first resist pattern 1b having been subjected to freezing treatment, and then the wafer is baked at 115° C. for 60 seconds to thereby form second resist film 2 having a thickness of 160 nm. The area where first resist pattern 1b is not present of the obtained wafer is subjected to pattern exposure with the ArF excimer laser scanner via mask m3 having a pitch of 180 nm and a line width of 90 nm.

Figure 1K:
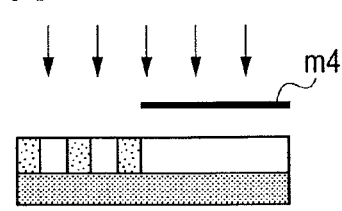
Figure 1L:
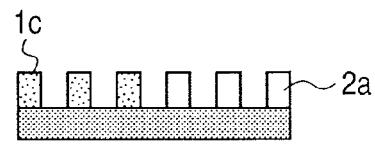

FIGS. 1K and 1L:

Subsequently, the mixed part of first resist pattern 1b and second resist film 2 is subjected to exposure with the above ArF excimer laser scanner at a quantity of exposure of 30 mJ/cm² through exposure mask m4 shading the part comprising the second resist film alone. After that, the pattern is heated at 115° C. for 60 seconds, and then subjected to development with a tetramethylammonium hydroxide aqueous solution (2.38 mass %) for 30 seconds, rinsing with pure water, and spin drying. In this manner, the exposed part of resist film 2 and resist film 2 of the part where first resist pattern 1b is present exposed through mask m3 are completely removed to form second resist pattern 2a, and bare first resist pattern 1b. Thus, the pattern consisting of first resist pattern 1c and second resist pattern 2a having a pitch of 180 nm and a line width of 90 nm arranging on the wafer is formed.

ArF Immersion Exposure:

A pattern is formed in the same manner as described in the above "ArF dry exposure" except that pure water is used as the immersion liquid, PAS5500/1250i (manufactured by ASML) equipped with a lens of NA0.85 is used as ArF excimer laser scanner, the dimension of the pattern is changed to a pitch of 130 nm, a line width of 65 nm, and the film thickness is changed to 120 nm.

The results obtained by the above compositions and the methods are shown in Tables 4 and 5 below.

With referring to FIGS. 1A to 1L, the terms in Tables 4 and 5 are explained below.

Dimensional fluctuation ratio before and after treatment is the dimensional fluctuation of first resist pattern after surface treatment (1b) to first resist pattern before treatment (1a) expressed in a ratio (1b/1a×100(%)). Since it is preferred that the dimensional fluctuation of a pattern before and after surface treatment is not caused, the nearer to 100%, the preferred is the ratio.

Ratio of finished dimension is the finished dimension of second resist pattern (2a) to first resist pattern (1c) expressed in a ratio ($2a/1c\times100(\%)$). Since it is preferred that the dimensions of first resist pattern and second resist pattern are equal, the nearer to 100%, the preferred is the ratio.

Ratio of pattern height is the height of second resist pattern ($2a$) to the height of first resist pattern ($1c$) expressed in a ratio ($2a/1c\times100(\%)$). Since it is preferred that the heights of first resist pattern and second resist pattern are equal, the nearer to 100%, the preferred is the ratio.

Ratio of etching speed is the etching speed of second resist pattern ($2a$) to that of first resist pattern ($1c$) expressed in a ratio ($2a/1c\times100(\%)$). Since it is preferred that the etching speeds of first resist pattern and second resist pattern are equal, the nearer to 100%, the preferred is the ratio.

The results of evaluations by dry exposure system are shown in Table 4 and those by immersion exposure are shown in Table 5. Incidentally, in Tables 4 and 5, * means that pattern $1a$ completely disappears after treatment with the treating agent.

TABLE 4

| Example No. | First Resist | Second Resist | Treating Agent | Dimensional Fluctuation Ratio before And after Treatment ($1b/1a \times 100$ (%)) | Ratio of Finished Dimension ($2a/1c \times 100$ (%)) | Ratio of Pattern Height ($2a/1c \times 100$ (%)) | Ratio of Etching Speed ($2a/1c \times 100$ (%)) |
|---|---|---|---|---|---|---|---|
| Example 1 | Ar-01 | Ar-01 | F-02 | 100 | 97 | 98 | 97 |
| Example 2 | Ar-02 | Ar-02 | F-02 | 100 | 97 | 97 | 98 |
| Example 3 | Ar-03 | Ar-03 | F-02 | 101 | 97 | 97 | 98 |
| Example 4 | Ar-04 | Ar-04 | F-02 | 101 | 98 | 97 | 97 |
| Example 5 | Ar-05 | Ar-05 | F-02 | 100 | 97 | 98 | 98 |
| Example 6 | Ar-01 | Ar-01 | F-01 | 100 | 95 | 94 | 95 |
| Example 7 | Ar-01 | Ar-01 | F-03 | 104 | 98 | 98 | 98 |
| Example 8 | Ar-01 | Ar-01 | F-04 | 102 | 100 | 99 | 101 |
| Example 9 | Ar-01 | Ar-01 | F-05 | 101 | 98 | 97 | 98 |
| Example 10 | Ar-01 | Ar-01 | F-06 | 101 | 99 | 99 | 99 |
| Example 11 | Ar-01 | Ar-01 | F-07 | 104 | 100 | 100 | 101 |
| Example 12 | Ar-01 | Ar-01 | F-08 | 112 | 111 | 112 | 115 |
| Example 13 | Ar-01 | Ar-01 | F-09 | 102 | 99 | 99 | 99 |
| Example 14 | Ar-01 | Ar-01 | F-10 | 102 | 99 | 98 | 99 |
| Example 15 | Ar-01 | Ar-01 | F-11 | 100 | 98 | 98 | 98 |
| Example 16 | Ar-01 | Ar-01 | F-12 | 100 | 95 | 96 | 95 |
| Comparative Example 1 | Ar-01 | Ar-01 | None | 0* | — | — | — |

TABLE 5

| Example No. | First Resist | Second Resist | Treating Agent | Dimensional Fluctuation Ratio before And after Treatment ($1b/1a \times 100$ (%)) | Ratio of Finished Dimension ($2a/1c \times 100$ (%)) | Ratio of Pattern Height ($2a/1c \times 100$ (%)) | Ratio of Etching Speed ($2a/1c \times 100$ (%)) |
|---|---|---|---|---|---|---|---|
| Example 1 | Ar-01 | Ar-01 | F-02 | 100 | 98 | 97 | 97 |
| Example 2 | Ar-02 | Ar-02 | F-02 | 101 | 97 | 97 | 97 |
| Example 3 | Ar-03 | Ar-03 | F-02 | 100 | 98 | 98 | 97 |
| Example 4 | Ar-04 | Ar-04 | F-02 | 101 | 98 | 97 | 98 |
| Example 5 | Ar-05 | Ar-05 | F-02 | 101 | 97 | 97 | 97 |
| Example 6 | Ar-01 | Ar-01 | F-01 | 101 | 93 | 93 | 95 |
| Example 7 | Ar-01 | Ar-01 | F-03 | 103 | 97 | 97 | 98 |
| Example 8 | Ar-01 | Ar-01 | F-04 | 101 | 100 | 99 | 102 |
| Example 9 | Ar-01 | Ar-01 | F-05 | 101 | 97 | 98 | 97 |
| Example 10 | Ar-01 | Ar-01 | F-06 | 101 | 98 | 98 | 99 |
| Example 11 | Ar-01 | Ar-01 | F-07 | 103 | 100 | 101 | 100 |
| Example 12 | Ar-01 | Ar-01 | F-08 | 113 | 113 | 112 | 114 |
| Example 13 | Ar-01 | Ar-01 | F-09 | 102 | 98 | 99 | 98 |
| Example 14 | Ar-01 | Ar-01 | F-10 | 102 | 98 | 99 | 98 |
| Example 15 | Ar-01 | Ar-01 | F-11 | 100 | 98 | 98 | 99 |
| Example 16 | Ar-01 | Ar-01 | F-12 | 100 | 96 | 95 | 96 |
| Comparative Example 1 | Ar-01 | Ar-01 | None | 0* | — | — | — |

Measurement of the Dimension of Pattern:

The dimensions of resist patterns formed by the above method are measured with a scanning electron microscope for measurement (SEM, model S-9380II, manufactured by Hitachi Limited).

Measurement of the Height of Pattern:

The heights of resist patterns formed by the above method are measured with an SEM (model S-4800, manufactured by Hitachi Limited).

Evaluation of Dry Etching Resistance:

Each resist composition prepared in the same manner as above is coated on a silicon wafer subjected to hexamethyldisilazane by spin coating, and baked at 115° C. for 60 seconds to form a resist film having a film thickness of 200 nm. The resist film is subjected to etching treatment with a parallel flat type reactive ion etching apparatus (manufactured by Ulvac) with oxygen as the etching gas on the condition of the pressure of 20 milli-torr, and application power of 100 mW/cm$^3$. The etching speed of the resist film is obtained from the variation in film thickness. The etching speed of a resist film in the case of being subjected to freezing treatment with the treating agent and the etching speed of a resist film in the case of not being treated are computed, and the dry etching resistance is computed from the ratio of their speeds (etching speeds after treatment to before treatment).

From the results in Tables 4 and 5, in the evaluations of characteristics by ArF dry exposure and ArF immersion exposure, it is found that when the treating agent for pattern formation of the invention is used, as compared with the comparative example not using the treating agent:

(i) The first resist pattern does not dissolve in the second resist solution;

(ii) The dimensional fluctuation of the first resist pattern is greatly restrained, as a result, the first resist pattern and the second resist pattern can be formed in the same dimension; and (iii) The dry etching resistance of the film coated with the first resist and the film coated with the second resist is the same.

Thus, the treating agent for pattern formation of the invention acts on a resist pattern so as to satisfy all of the characteristics required in a freezing process. Therefore, it is apparent that the treating agent for pattern formation of the invention shows excellent pattern-forming ability in a freezing process.

According to the invention, in the freezing process comprising forming a first resist pattern on a first resist film, and then forming a second resist film on the first resist pattern to form a second resist pattern thereon by subjecting the first resist pattern to chemical or physical treatment to thereby change the property of the first resist pattern so as not to dissolve in a second resist solution, a surface treating agent for the freezing process is provided to perform the chemical or physical treatment of the first resist pattern so as to satisfy all the requisites of (i) the first resist pattern does not dissolve in the second resist solution, and (ii) the dimension of the first resist pattern does not vary, and further (iii) the dry etching resistances of the first resist pattern and the second resist pattern are the same. Further, according to the invention, it becomes possible to form a fine pattern in high productivity.

The entire disclosure of each and every foreign patent application from which the benefit of foreign priority has been claimed in the present application is incorporated herein by reference, as if fully set forth.

What is claimed is:

1. A method for forming a resist pattern, comprising:
   forming a first resist pattern with a first resist composition;
   treating the first resist pattern with a surface-treating agent; and
   forming a second resist pattern on the first resist pattern with a second resist composition,
   wherein the surface-treating agent contains a compound represented by formula (1):

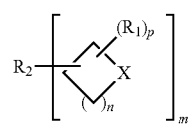

wherein m represents an integer of from 1 to 8;
   $R_1$ represents a monovalent organic group;
   $R_2$ represents an m-valent organic group, provided that $R_1$ and $R_2$ may be bonded to each other to form a ring, and when p represents 2 or more, a plurality of $R_1$'s may be bonded to each other to form a ring;
   X represents an oxygen atom or a sulfur atom;
   n represents an integer of from 0 to 10; and
   p represents an integer of 2n+3 or less, and
   wherein the surface-treating agent is used in a step between a formation of the first resist pattern on a first resist film and a formation of a second resist film on the first resist pattern to form the second resist pattern.

2. The method for forming a resist pattern according to claim 1,
   wherein in the compound represented by formula (1), m represents 2 or more.

3. The method for forming a resist pattern according to claim 1,
   wherein the surface-treating agent further contains:
   at least one organic solvent selected from the group consisting of an alcohol solvent, a carbon fluoride solvent and a saturated hydrocarbon solvent.

4. The method for forming a resist pattern according to claim 1,
   wherein the compound represented by formula (1) has a molecular weight of from 100 to 1,000.

5. The method for forming a resist pattern according to claim 1,
   wherein in the compound represented by formula (1), n is 1 or 2.

6. The method for forming a resist pattern according to claim 1,
   wherein in the compound represented by formula (1), the m-valent organic group represented by $R_2$ has an aromatic ring.

7. The method for forming a resist pattern according to claim 1,
   wherein in the compound represented by formula (1), the number of carbon atoms of $R_2$ exclusive of carbon atoms forming a ring is from 1 to 30.

8. The method for forming a resist pattern according to claim 1,
   wherein the surface-treating agent changes a property of the first resist pattern so that the first resist pattern does not dissolve in a resist solution used in the formation of the second resist film.

9. A resist pattern which is formed by the method for forming a resist pattern according to claim 1.

* * * * *